(12) United States Patent
Wang et al.

(10) Patent No.: US 12,119,301 B2
(45) Date of Patent: Oct. 15, 2024

(54) SEMICONDUCTOR DEVICE

(71) Applicant: Socionext Inc., Kanagawa (JP)

(72) Inventors: Wenzhen Wang, Yokohama (JP); Atsushi Okamoto, Yokohama (JP); Hirotaka Takeno, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 405 days.

(21) Appl. No.: 17/716,299

(22) Filed: Apr. 8, 2022

(65) Prior Publication Data

US 2022/0230954 A1    Jul. 21, 2022

Related U.S. Application Data

(63) Continuation of application No. PCT/JP2019/040258, filed on Oct. 11, 2019.

(51) Int. Cl.
*H01L 23/528* (2006.01)
*H01L 23/522* (2006.01)

(52) U.S. Cl.
CPC ........ *H01L 23/528* (2013.01); *H01L 23/5226* (2013.01)

(58) Field of Classification Search
CPC .......................... H01L 23/528; H01L 23/5226
See application file for complete search history.

(56) References Cited

U.S. PATENT DOCUMENTS

| 8,530,273 B2 | 9/2013 | Den Boer |
| 9,754,923 B1 | 9/2017 | Xie et al. |
| 10,879,025 B2 * | 12/2020 | Mori ..................... H01H 1/0094 |
| 10,950,546 B1 | 3/2021 | Doornbos |
| 11,004,789 B2 | 5/2021 | Doornbos et al. |
| 2012/0074399 A1 * | 3/2012 | Den Boer ......... H01L 29/78603 438/30 |
| 2013/0300462 A1 | 11/2013 | Koyama et al. |

(Continued)

FOREIGN PATENT DOCUMENTS

| JP | S53-026689 A | 3/1978 |
| JP | H05-206420 A | 8/1993 |

(Continued)

OTHER PUBLICATIONS

International Search Report (ISR) dated Nov. 19, 2019 issued in International Patent Application No. PCT/JP2019/040258, with English translation.

*Primary Examiner* — Marc Anthony Armand
(74) *Attorney, Agent, or Firm* — Rimon P.C.

(57) ABSTRACT

A semiconductor device includes a chip that includes a substrate and a first interconnection layer on a surface of the substrate; and a second interconnection layer on another surface opposite to the surface of the substrate. The second interconnection layer includes a first power line having a first power potential, a second power line having a second power potential, and a switch between the first power line and the second power line. The chip includes a first grounding line, a third power line having the second power potential, a first region having the first grounding line and the third power line, a second grounding line, a fourth power line having the first power potential, and a second region having the second grounding line and the fourth power line. In plan view, the switch is between the first region and the second region.

15 Claims, 30 Drawing Sheets

(56) References Cited

U.S. PATENT DOCUMENTS

2015/0162448 A1 6/2015 Raghavan et al.
2015/0187642 A1 7/2015 Batra et al.
2018/0145030 A1 5/2018 Beyne et al.

FOREIGN PATENT DOCUMENTS

| JP | H11-102910 A | 4/1999 |
| JP | 2009-302198 A | 12/2009 |
| JP | 2012-044042 A | 3/2012 |
| JP | 2014-165358 A | 9/2014 |
| JP | 2018-107463 A | 7/2018 |

* cited by examiner

SEMICONDUCTOR DEVICE

CROSS-REFERENCE TO RELATED APPLICATION

The present application is a continuation of international application No. PCT/JP2019/040258, filed on Oct. 11, 2019, and designated the U.S., the entire contents of which are incorporated herein by reference.

BACKGROUND OF THE INVENTION

1. Field of the Invention

The present invention relates to a semiconductor device.

2. Description of the Related Art

A semiconductor device includes various circuit regions, one example of which is a standard cell region. The standard cell region includes various logic circuits and a power switch circuit.

The power switch circuit, which is provided between, for example, a power line that supplies a VDD power potential to the semiconductor device and a power line that supplies a VVDD power potential to transistor of the logic circuit, switches between states of supplying and not supplying the power potential VVDD to the transistor. By using the power switch circuit, the power supply is turned off when there is no need to operate the logic circuit, and the leakage current generated in the transistor included in the logic circuit is reduced, thereby reducing the power consumption.

A technique has been proposed in which a secondary semiconductor chip that includes an interconnection is attached to the back side of a main semiconductor chip and a power potential is supplied to a transistor of the main semiconductor chip via the interconnection of the secondary semiconductor chip. Such a technique is sometimes called a backside-power delivery network (BS-PDN).

PRIOR ART DOCUMENTS

Patent Documents

[Patent Document 1] U.S. Patent Application Publication No. 2015/0162448
[Patent Document 2] U.S. Pat. No. 9,754,923
[Patent Document 3] U.S. Patent Application Publication No. 2018/0145030
[Patent Document 4] U.S. Pat. No. 8,530,273
[Patent Document 5] Japanese Patent No. 6469269

SUMMARY

In one aspect of the disclosed art, a semiconductor device includes a first chip that includes a substrate and a first interconnection layer formed on a first surface of the substrate. The semiconductor device further includes a second interconnection layer formed on a second surface opposite to the first surface of the substrate. The second interconnection layer includes a first power line to which a first power potential is applied, a second power line to which a second power potential is applied, and a switch connected between the first power line and the second power line. The first chip includes a first grounding line, a third power line to which the second power potential is applied, a first region in which the first grounding line and the third power line are disposed, a second grounding line, a fourth power line to which the first power potential is applied, and a second region in which the second grounding line and the fourth power line are disposed. In plan view, the switch is disposed between the first region and the second region.

The object and advantages of the invention will be implemented and attained by the elements and combinations particularly pointed out in the appended claims.

It is to be understood that both the foregoing general description and the following detailed description are exemplary and explanatory and are not restrictive of the invention as claimed.

BRIEF DESCRIPTION OF DRAWINGS

Other objects and further features of embodiments will become apparent from the following detailed description when read in conjunction with the accompanying drawings, in which.

DESCRIPTION OF EMBODIMENTS

Figure 1:
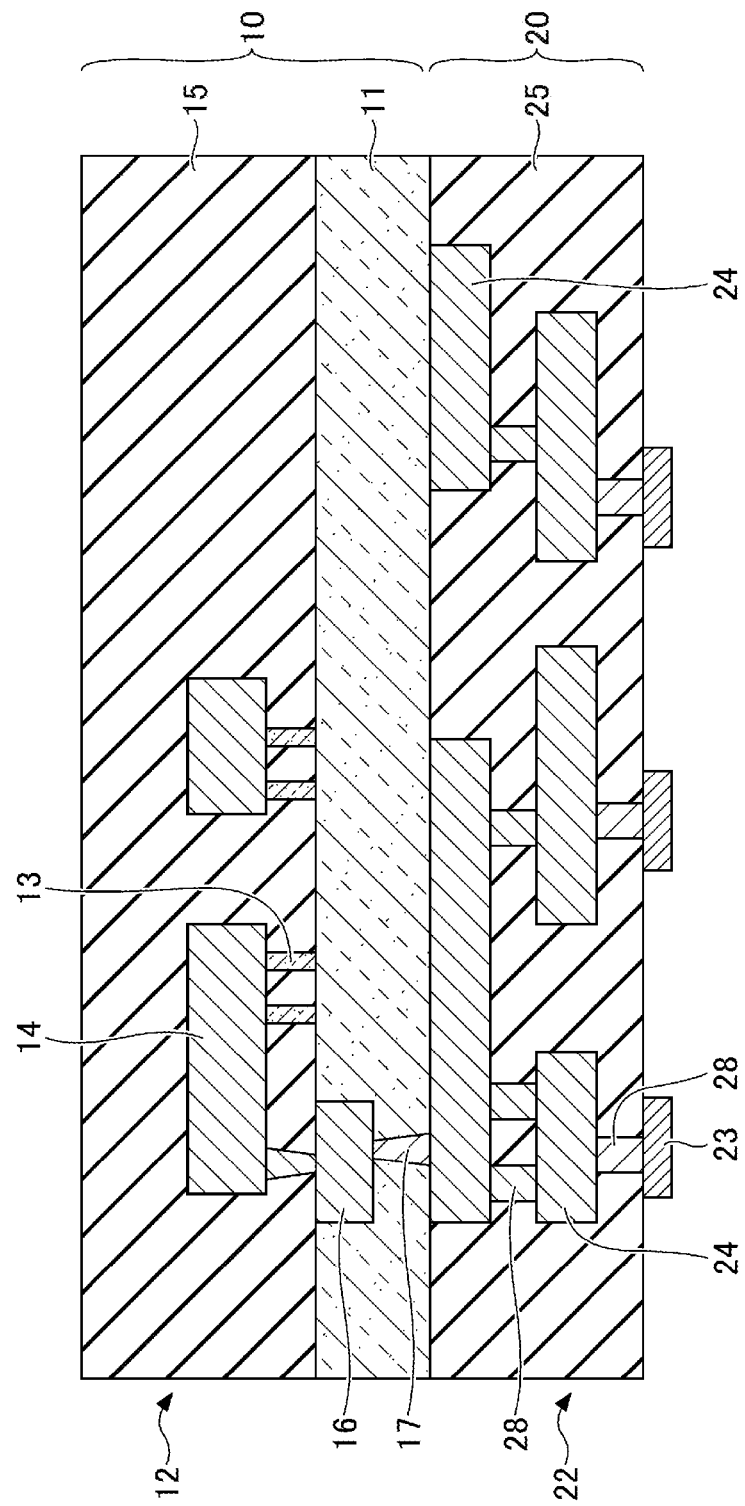
FIG. 1 is a cross-sectional diagram depicting an outline of a semiconductor device according to a first embodiment.

Concerning the related art described above, so far, no detailed consideration has been made of the specific configuration of providing a power switch circuit in such a secondary semiconductor chip that includes an interconnection.

It is an object of embodiments of the present invention to provide a semiconductor device capable of appropriately providing a power switch circuit.

In accordance with the embodiments, a power switch circuit can be provided appropriately.

Hereinafter, the embodiments will be described in detail with reference to the accompanying drawings. In the present specification and the drawings, for components having substantially the same functional structures, duplicate descriptions may be omitted by providing the same reference numerals. In the following description, two directions parallel to the surface of the substrate and perpendicular to each other are referred to as a X-direction and a Y-direction; and the direction perpendicular to the surface of the substrate is referred to as a Z-direction. Moreover, the expression that layouts are the same as each other in the present disclosure does not strictly mean that any layout difference occurring due to manufacturing variation is not allowed, and even if any layout difference occurs due to manufacturing variation, it can be regarded as layouts being the same as each other.

First Embodiment

A first embodiment will now be described. FIG. 1 is a cross-sectional diagram depicting an outline of a semiconductor device according to the first embodiment. As depicted in FIG. 1, the semiconductor device according to the first embodiment includes a first chip 10 and a second chip 20.

The first chip 10 is, for example, a semiconductor chip and includes a substrate 11 and a first interconnection layer 12. The substrate 11 is, for example, a silicon substrate, and a semiconductor element, such as a transistor, is formed on the front side of the substrate 11. The transistor is a FinFET including, for example, fins 13 in a source, a drain and a channel. The first interconnection layer 12 is formed on the front side of the substrate 11 and includes an interconnection 14 and an insulating layer 15. Portions of the interconnection 14 are connected to the fins 13. In addition, on the front side of the substrate 11, for example, a power line 16 connected to the interconnection 14 is formed, and a via 17 is provided in the substrate 11 from the power line 16 to reach the back side of the substrate 11. The via 17 is, for example, a silicon-penetrating via (through-silicon via: TSV). As depicted in FIG. 1, a portion of the interconnection 14 may have a via-like configuration and be connected to the power line 16.

The second chip 20 is, for example, a semiconductor chip and is positioned to face the back side of the substrate 11 of the first chip 10. The second chip 20 includes, for example, a second interconnection layer 22 and pads 23. The second interconnection layer 22 includes an interconnection 24 and an insulating layer 25. The top surface of the second interconnection layer 22 faces the back surface of the substrate 11 of the first chip 10, for example. That is, the substrate 11 is positioned between the first interconnection layer 12 and the second interconnection layer 22. The second interconnection layer 22 may include a plurality of interconnections 24, as depicted in FIG. 1. The plurality of interconnections 24 may be connected via vias 28 provided in the second interconnection layer 22. The pads 23 are external connection terminals connected to, for example, an interconnection substrate or board. A portion of the interconnections 24 is connected to a via 17. The pads 23 are provided on the back side of the second interconnection layer 22 and are connected to the interconnections 24 through vias 28. The second interconnection layer 22 is supplied with a power potential and a signal is transmitted through the pad 23.

The second chip 20 may be as large as the first chip 10 or larger than the first chip 10. The pads 23 may be provided outside of the first chip 10 in plan view on the face of the second chip 20 opposite to the first chip 10. Hereinafter, a plan view of the front side of the first chip 10 is referred to as a plan view.

The second interconnection layer 22 may be provided by forming the interconnections 24 and the insulating layer 25 and the like on the back side of the substrate 11. The second interconnection layer 22 may be formed on a second substrate on which a TSV is formed and the pads 23 may be provided on the back side of the second substrate.

Note that the cross-sectional diagram depicted in FIG. 1 depicts an outline of the semiconductor device, and the details thereof will be depicted with reference to FIGS. 9 to 12.

Figure 2:
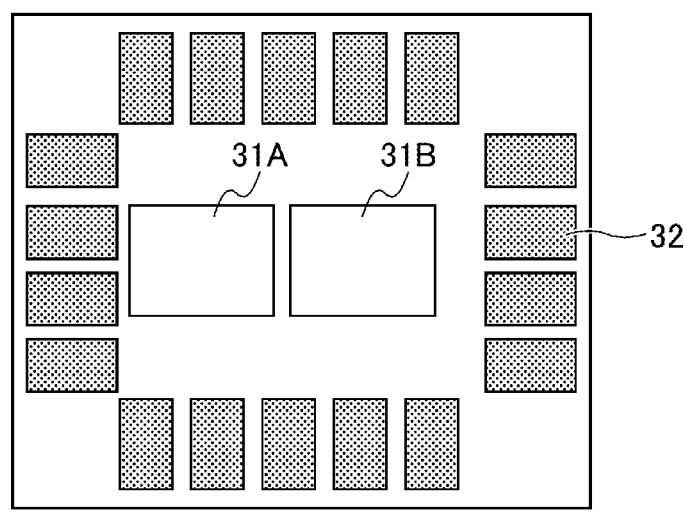
FIG. 2 is a diagram depicting a layout in a first chip according to the first embodiment.

Next, the layout in the first chip 10 will be described. FIG. 2 is a diagram depicting a layout in the first chip 10.

As depicted in FIG. 2, the first chip 10 includes a first power domain 31A, a second power domain 31B, and input and output (I/O) cell regions 32. The I/O cell regions 32 are disposed, for example, around the first power domain 31A and the second power domain 31B. The number of first power domains 31A and the number of second power domains 31B may be two or more.

Figure 3:
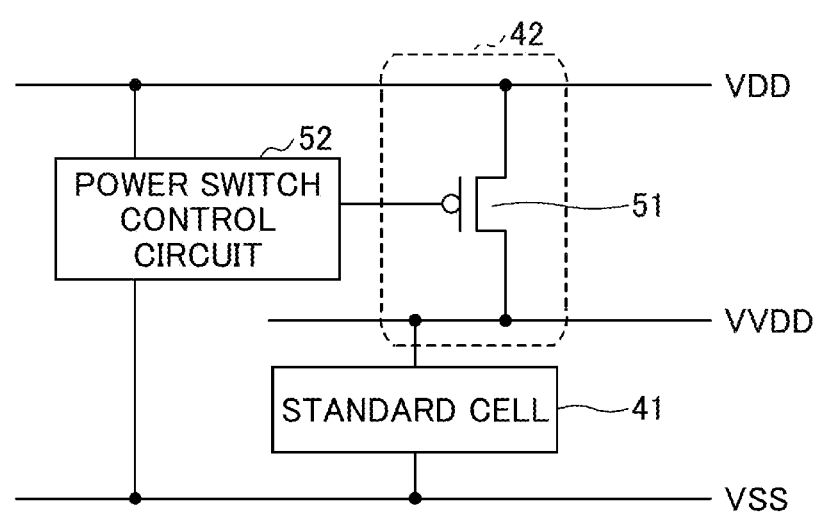
FIG. 3 is a circuit diagram depicting a configuration of a circuit included in the semiconductor device according to the first embodiment.

Next, the circuit included in the semiconductor device according to the first embodiment will be described. FIG. 3 is a circuit diagram depicting a configuration of the circuit included in the semiconductor device according to the first embodiment.

As depicted in FIG. 3, the semiconductor device according to the first embodiment includes a standard cell 41, a power switch circuit 42, and a power switch control circuit 52. The power switch control circuit 52 is provided in the first power domain 31A of the first chip 10. The standard cell 41 is provided in the second power domain 31B of the first chip 10. The standard cell 41 includes various logic circuits, such as NAND circuits, inverters, and the like. The power switch control circuit 52 includes a buffer as will be described later. In the first power domain 31A, there is a VSS interconnection for supplying the ground potential to the power switch control circuit 52 and a VDD interconnection for supplying a power potential. The second power domain 31B has a VSS interconnection for supplying the ground potential to the standard cell 41 and a VVDD interconnection for supplying a power potential.

The power switch circuit 42 is provided in the second chip 20, as will be described in detail later. The power switch circuit 42 includes a switch transistor 51. The switch transistor 51 is a p-channel MOS transistor, for example, connected between a VDD interconnection and a VVDD interconnection. The power switch control circuit 52 is connected to the gate of the switch transistor 51 to control the operation of the switch transistor 51. The power switch control circuit 52 switches the state of the switch transistor 51 between the turned on state and the turned off state and controls the conduction between the VDD interconnection and the VVDD interconnection. The power switch control circuit 52 includes, for example, a buffer. The switch transistor 51 may be a thin film transistor (TFT) or may be a micro electro mechanical systems (MEMS) switch. There may be a VSS interconnection that supplies the ground potential to the first power domain 31A and a VVSS interconnection that supplies the ground potential to the second power domain 31B, and an n-channel MOS transistor as a switch transistor 51 may be provided between the VSS interconnection and the VVSS interconnection.

Figure 4:
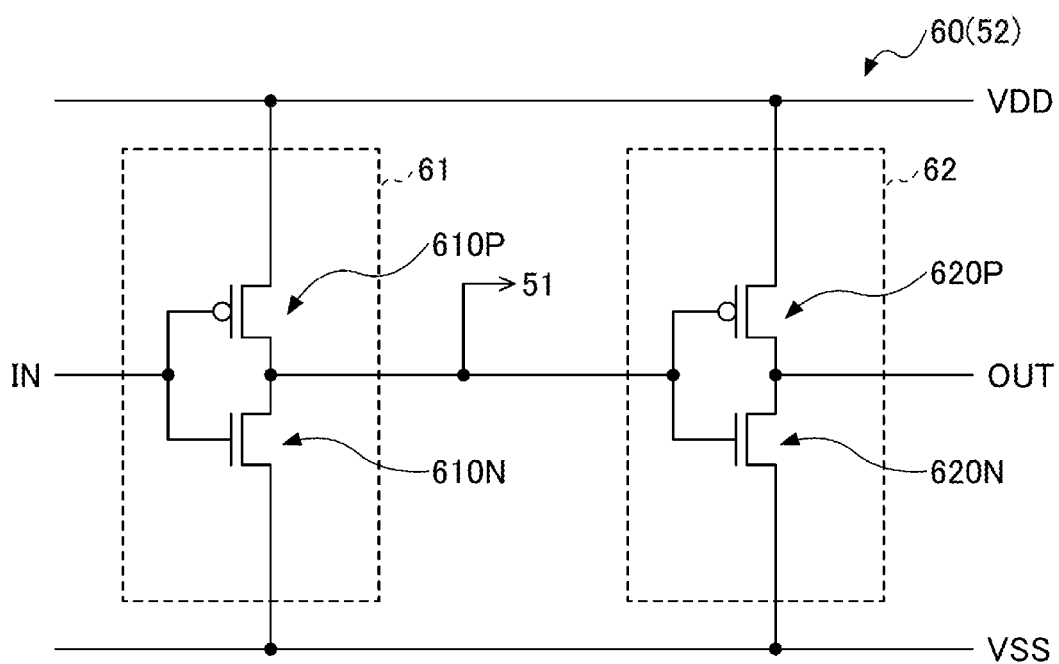
FIG. 4 is a circuit diagram depicting a configuration of a buffer.
Figure 5:
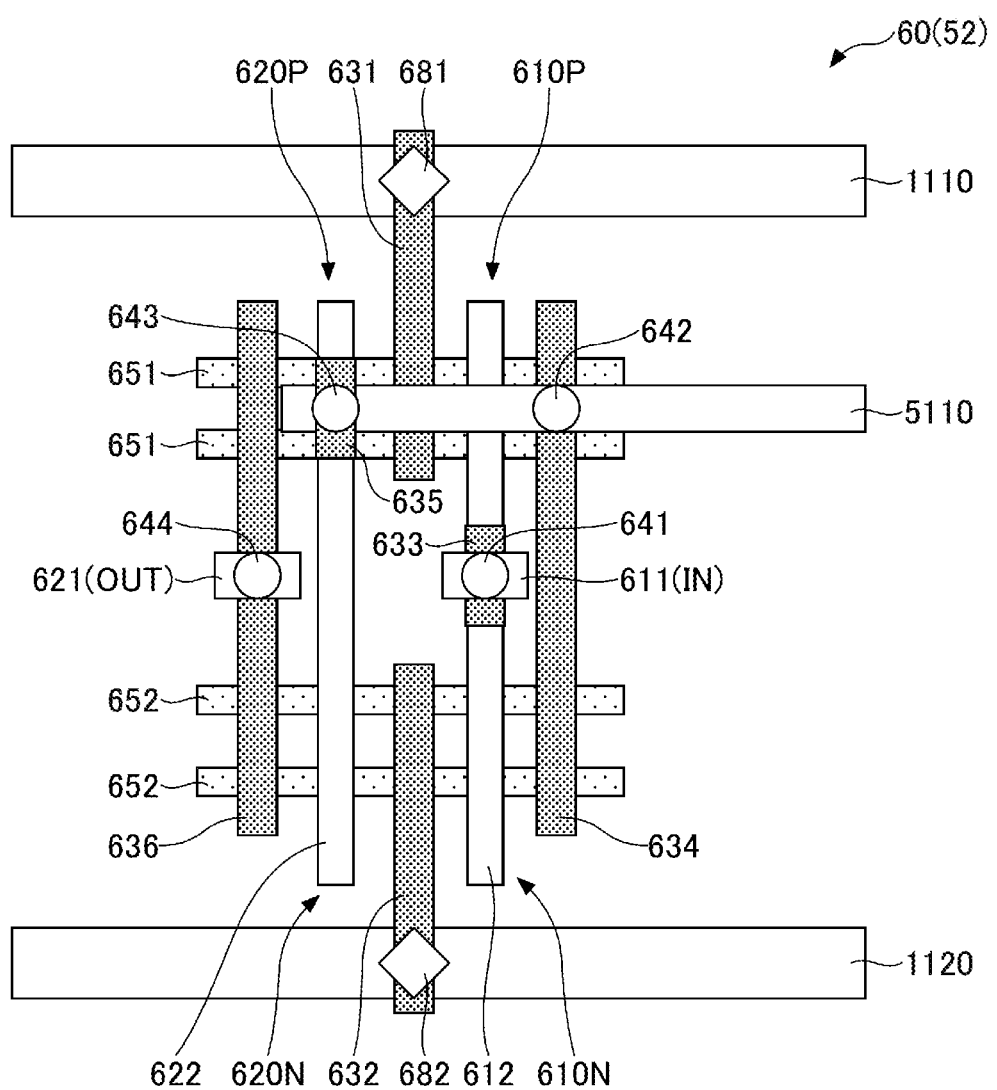
FIG. 5 is a schematic diagram depicting a configuration of the buffer in plan view.

Next, the configuration of the buffer included in the power switch control circuit 52 will be described. FIG. 4 is a circuit diagram depicting a buffer configuration. FIG. 5 is a schematic diagram depicting a configuration of the buffer in plan view.

As depicted in FIG. 4, the buffer 60 contained in the power switch control circuit 52 includes an inverter 61 and an inverter 62. An input signal IN is input to the inverter 61, an output of the inverter 61 is input to the gate of the switch transistor 51 and the inverter 62, and an output signal OUT is output from the inverter 62. The inverter 61 includes a p-channel MOS transistor 610P and an n-channel MOS transistor 610N. The inverter 62 includes a p-channel MOS transistor 620P and an n-channel MOS transistor 620N.

For example, as depicted in FIG. 5, a power line 1110 corresponding to a VDD interconnection and a power line 1120 corresponding to a VSS interconnection are provided. The power lines 1110 and 1120 extend in the X-direction. Semiconductor fins 651 extending in the X-direction are provided on the power line 1120 side of the power line 1110. The two fins 651 are provided, for example. Semiconductor fins 652 extending in the X-direction are provided on the power line 1120 side of the fins 651. The two fins 652 are provided, for example. A local interconnection 631 is provided which extends in the Y-direction and is connected to the fins 651 and is connected to the power line 1110 via a via 681. A local interconnection 632 is provided that extends in the Y-direction and is connected to the fins 652 and is connected to the power line 1120 via a via 682. A local interconnection 634 is provided in the X-direction of the local interconnections 631 and 632 to be connected to the fins 651 and 652. A local interconnection 636 is provided in the direction opposite to the X-direction of the local interconnections 631 and 632 and is connected to the fins 651 and 652.

A gate electrode 612 is provided intersecting via a gate insulating film (not depicted) the fins 651 and 652 between the local interconnection 631 and the local interconnection 634 and between the local interconnection 632 and the local interconnection 634. A gate electrode 622 is provided intersecting via a gate insulating film (not depicted) the fins 651 and 652 between the local interconnection 631 and the local interconnection 636 and between the local interconnection 632 and the local interconnection 636. The gate electrode 612 is connected to an interconnection 611 via a local interconnection 633 and a via 641. The gate electrode 622 is connected to a control signal line 5110 via a local interconnection 635 and a via 643. The control signal line 5110 is also connected to a local interconnection 634 via a via 642. The local interconnection 636 is connected to an interconnection 621 via a via 644. An input signal IN is input to the interconnection 611 and an output signal OUT is output from the interconnection 621 (see FIG. 4). The control signal line 5110 is connected to the gate of the switch transistor 51. That is, the control signal line 5110 functions as a signal line to transmit a control signal with respect to the switch transistor 51.

Note that the configurations of the inverters 61 and 62 are exemplary. For example, the number of pairs of the p-channel MOS transistors and the n-channel MOS transistors included in each of the inverters 61 and 62 may be two or more. The interconnection connected to the gate of the switch transistor 51 may also be connected to the input or output of the buffer 60.

Figure 6:
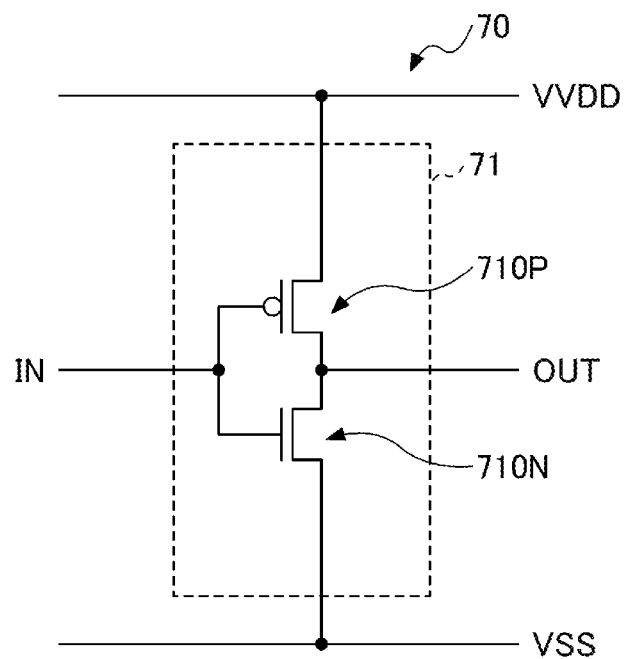
FIG. 6 is a circuit diagram depicting a configuration of an inverter.
Figure 7:
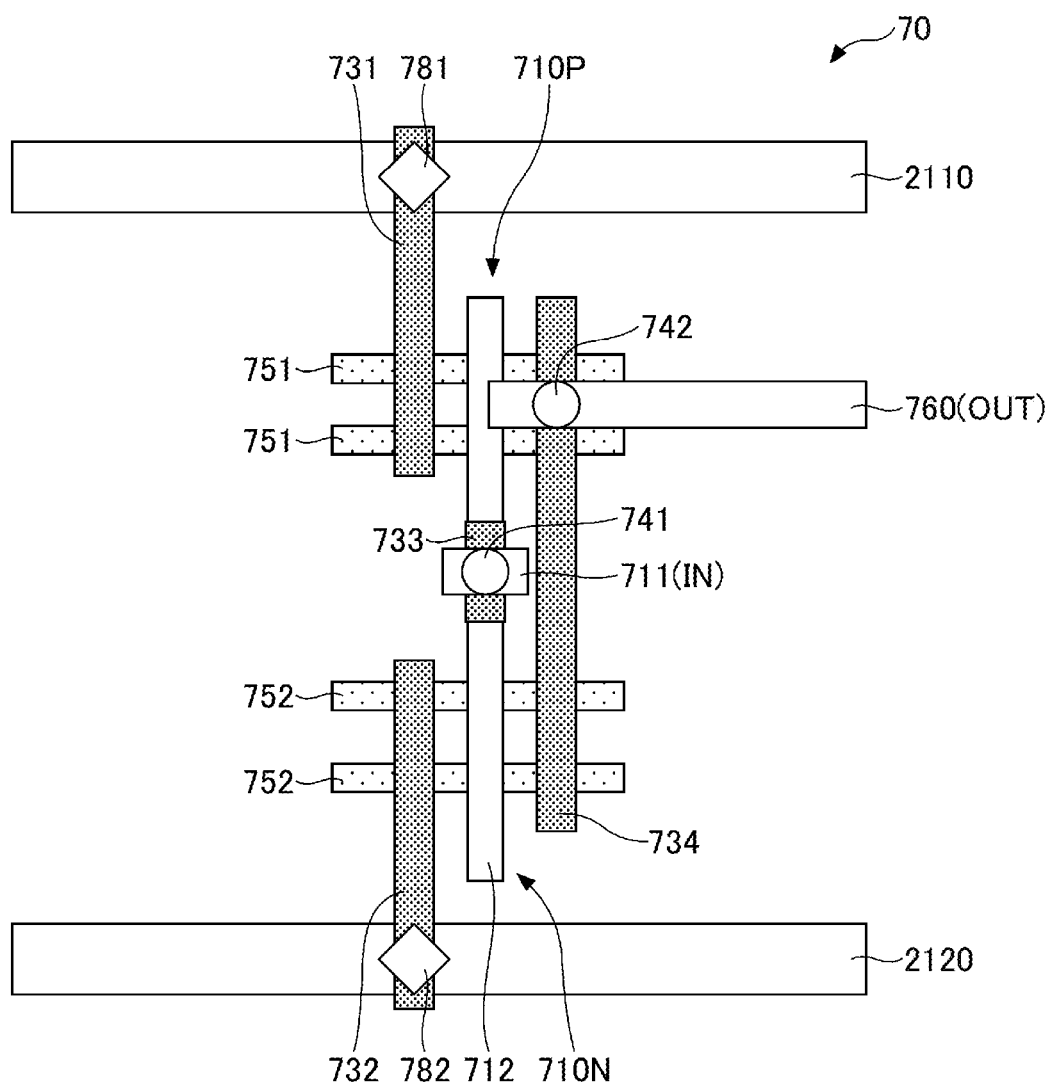
FIG. 7 is a schematic diagram depicting a configuration of the inverter in plan view.

Next, the configuration of an inverter as an example of the circuit included in the standard cell 41 will be described. FIG. 6 is a circuit diagram depicting the inverter configuration. FIG. 7 is a schematic diagram depicting a configuration of the inverter in plan view.

As depicted in FIG. 6, the inverter 70 includes a p-channel MOS transistor 710P and an re-channel MOS transistor 710N.

For example, as depicted in FIG. 7, a power line 2110 corresponding to a VVDD interconnection and a power line 2120 corresponding to a VSS interconnection are provided. The power lines 2110 and 2120 extend in the X-direction. Semiconductor fins 751 extending in the X-direction are provided on the power line 2120 side of the power line 2110. The two fins 751 are provided, for example. Semiconductor fins 752 extending in the X-direction are provided on the power line 2120 side of the fins 751. The two fins 752 are provided, for example. A local interconnection 731 is provided that extends in the Y-direction, is connected to the fins 751, and is connected to the power line 2110 via a via 781. A local interconnection 732 is provided that extends in the Y-direction, is connected to the fins 752, and is connected to the power line 2120 via a via 782. A local interconnection 734 is provided in the X-direction with respect to the local interconnections 731 and 732 and is connected to the fins 751 and 752.

A gate electrode 712 is provided intersecting the fins 751 and 752 via a gate insulating layer (not depicted) between the local interconnection 731 and the local interconnection 734 and between the local interconnection 732 and the local interconnection 734. The gate electrode 712 is connected to an interconnection 711 via a local interconnection 733 and a via 741. The local interconnection 734 is connected to an interconnection 760 via a via 742. An input signal IN is input to the interconnection 711 and an output signal OUT is output from the interconnection 760 (see FIG. 6).

Note that the circuit included in the standard cell 41 is not limited to an inverter, and may include a circuit such as any one or any ones of various logic circuits. The circuit included in the standard cell 41 may include a static random access memory (SRAM) cell. The circuit may be provided throughout a region that includes three or more power lines 2110 and 2120. That is, a so-called multi-height circuit may be included.

FIGS. 5 and 7 depict the transistors using fins (FinFETs), but the first and second power domains 31A and 31B may be provided with planar transistors, complementary field effect transistors (CFETs), transistors using nanowires, or the like.

Figure 8:
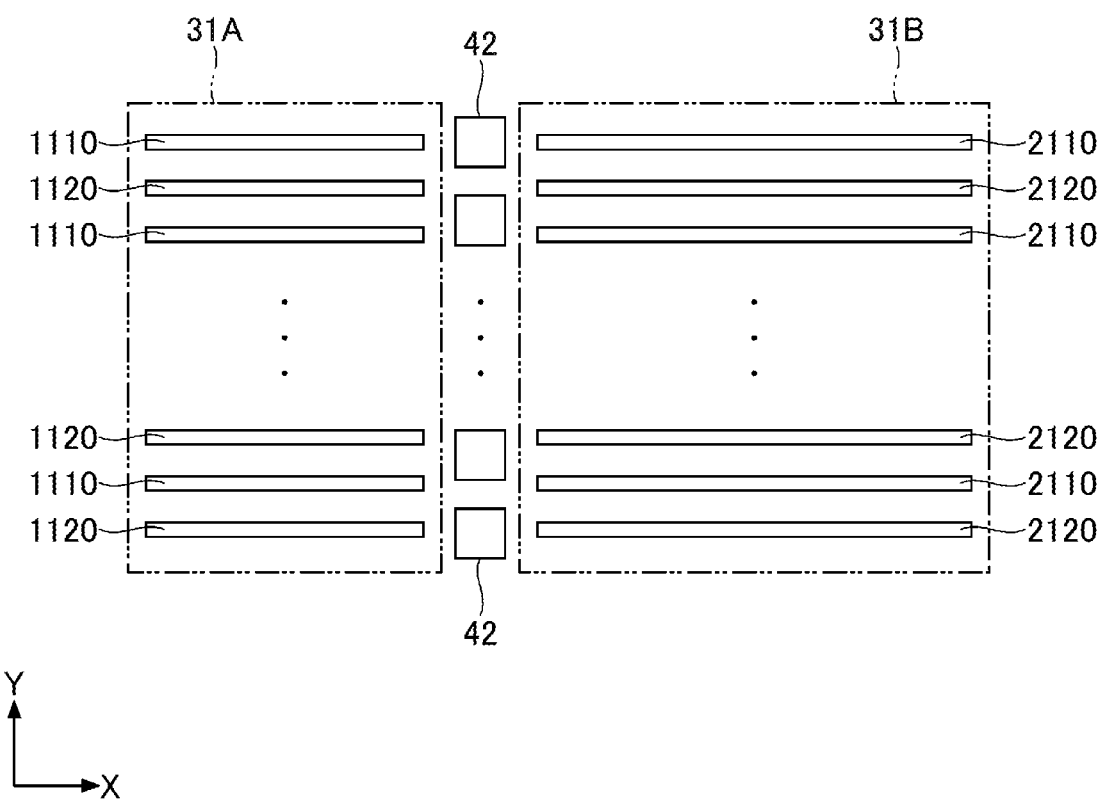
FIG. 8 is a schematic diagram depicting an outline of power domains in the first embodiment.

An outline of the first power domain 31A and the second power domain 31B will now be described. FIG. 8 is a schematic diagram depicting an outline of power domains in the first embodiment.

As depicted in FIG. 8, for example, the second power domain 31B is positioned in the X-direction with respect to the first power domain 31A. The first power domain 31A includes circuits connected to power lines 1110 and 1120. For example, the buffer 60 of the power switch control circuit 52 depicted in FIGS. 4 and 5 is included in the first power domain 31A. The second power domain 31B includes circuits connected to power lines 2110 and 2120. For example, the inverter 70 depicted in FIGS. 6 and 7 is included in the second power domain 31B. In plan view, the power switch circuits 42 are positioned between the first power domain 31A and the second power domain 31B. Note that, at least a portion of the first power domain 31A and the second power domain 31B may be arranged along an extending direction of the power line 1110 and the power line 2110, as depicted in FIG. 8, when the second power domain 31B is disposed around the first power domain 31A, for example.

Figure 9:
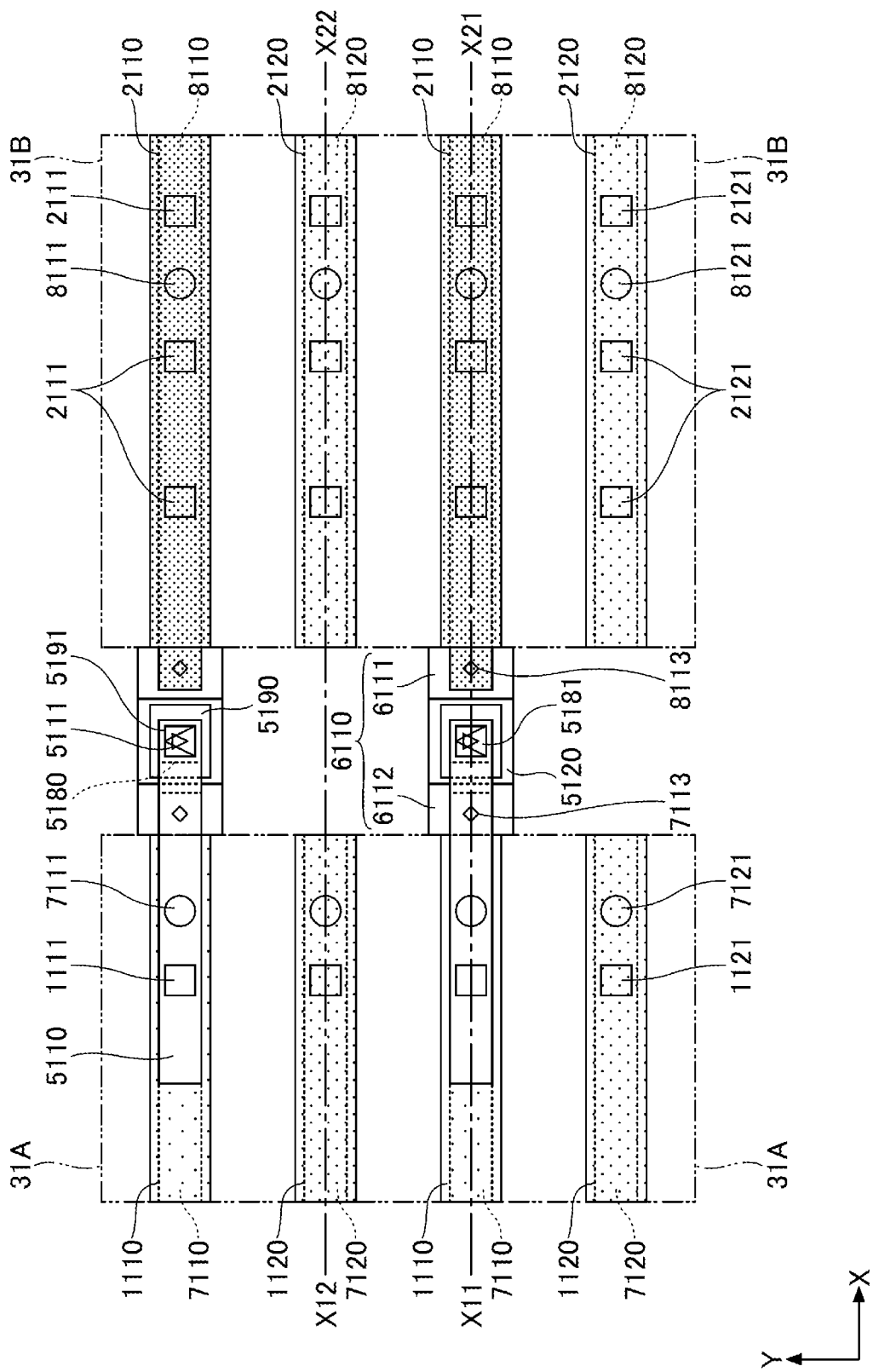
FIG. 9 is a schematic diagram depicting a configuration of a semiconductor device in plan view according to the first embodiment.
Figure 10:
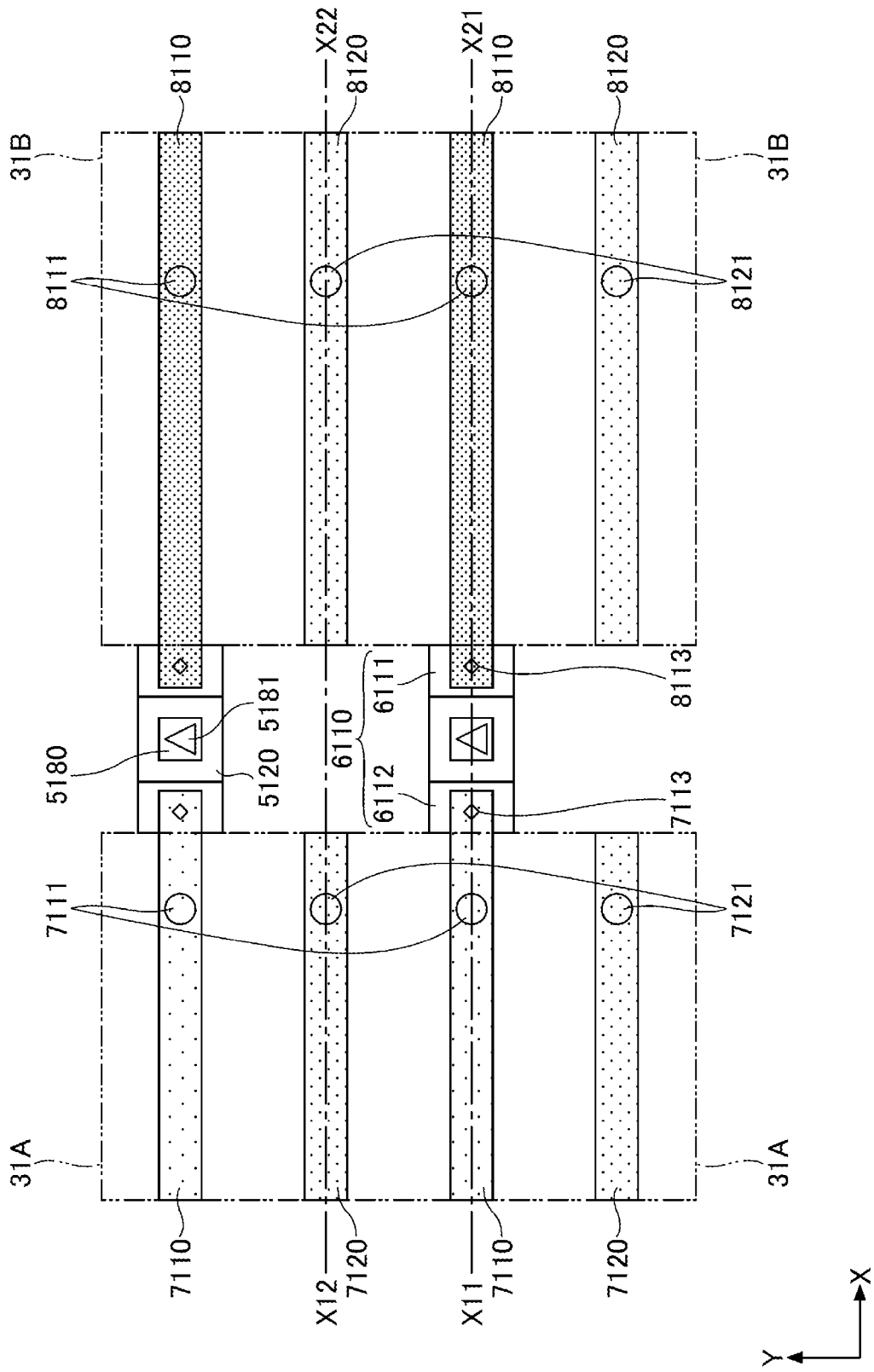
FIG. 10 is a schematic diagram depicting a configuration of the semiconductor device according to the first embodiment in plan view.
Figure 11:
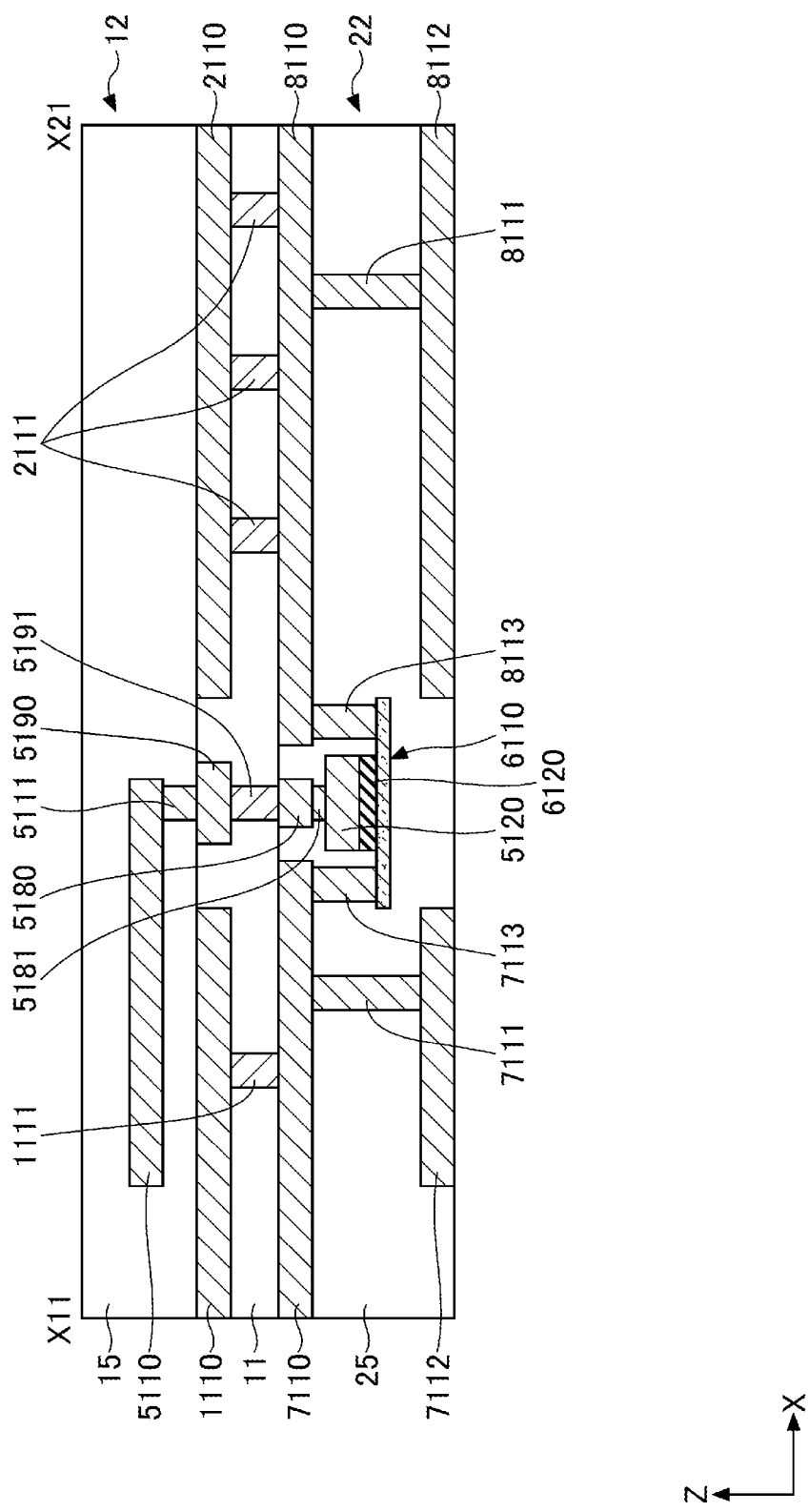
FIG. 11 is a cross-sectional diagram depicting the semiconductor device according to the first embodiment.
Figure 12:
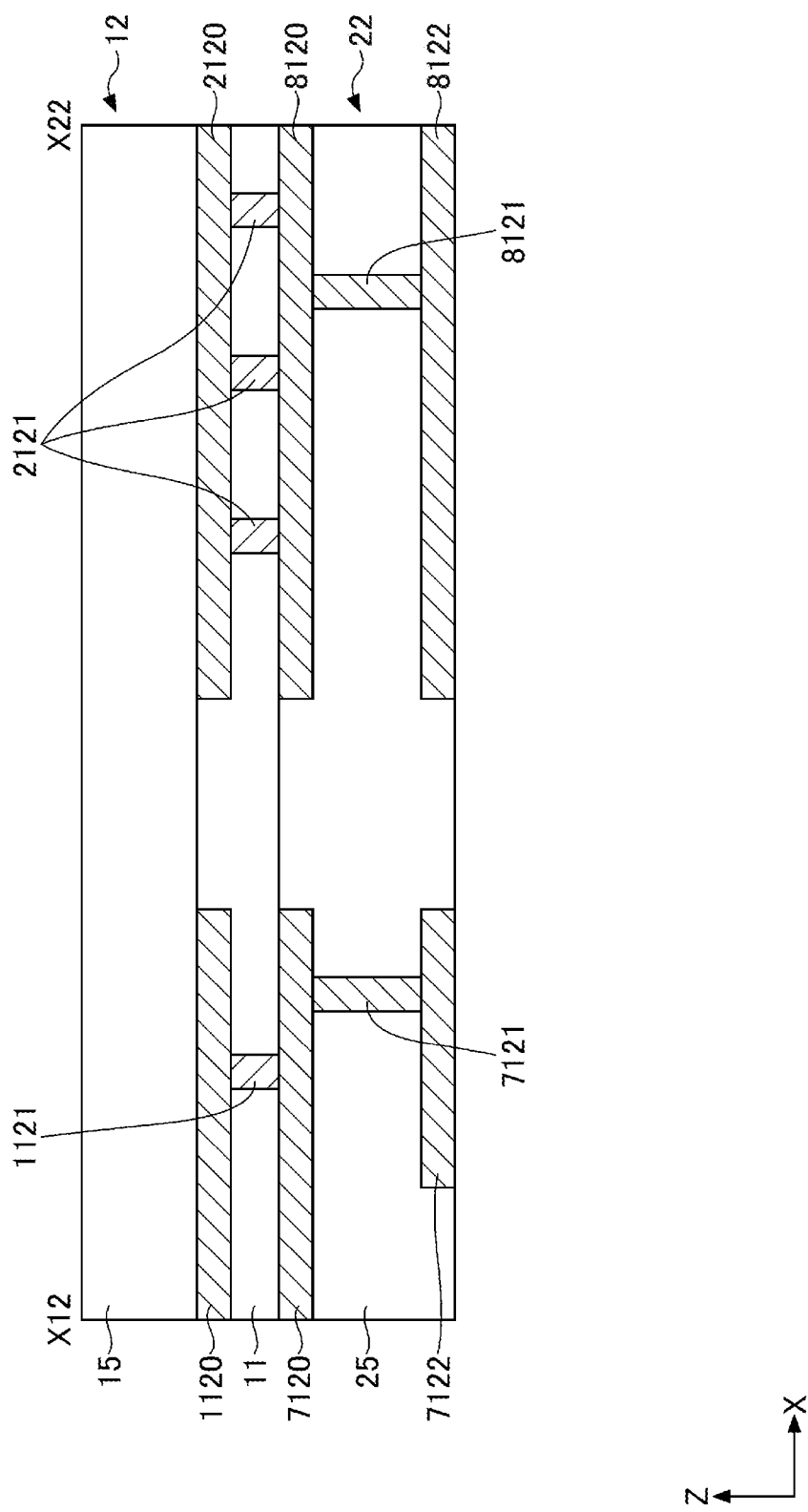
FIG. 12 is a cross-sectional diagram depicting the semiconductor device according to the first embodiment.

Next, the first chip 10 and the second chip 20 according to the first embodiment will be described in detail. FIGS. 9 and 10 are schematic diagrams depicting a configuration of the semiconductor device according to the first embodiment in plan view. FIGS. 11 and 12 are cross-sectional diagrams depicting the semiconductor device according to the first embodiment. FIG. 9 shows the internal configuration of the first chip 10 and the second chip 20, and FIG. 10 shows the internal configuration of the second chip 20. FIG. 11 corresponds to a cross-sectional diagram taken along the X11-X21 line in FIGS. 9 and 10, and FIG. 12 corresponds to a cross-sectional diagram taken along the X12-X22 line in FIGS. 9 and 10.

[First Power Domain 31A]

In the first power domain 31A, the power lines 1110 extending in the X-direction and the power lines 1120 extending in the X-direction are alternately arranged in the Y-direction. For example, the power lines 1110 correspond to VDD interconnections and the power lines 1120 correspond to VSS interconnections.

As depicted in FIGS. 9-12, a plurality of grooves extending in the X-direction are formed in the substrate 11, and the power lines 1110 and 1120 are formed in these grooves. The power lines 1110 and 1120 of such structures are sometimes referred to as buried power rails (BPR). A device isolation film (not depicted) may be formed on the surface of the substrate 11. The device isolation film is formed, for example, by a shallow trench isolation (STI) method. The surface of the device isolation film may be flush with the surface of the substrate 11 or need not be flush with the surface of the substrate 11.

The substrate 11 has vias 1111 and 1121 that are formed to penetrate the substrate 11 up to the back side thereof. The vias 1111 are formed under the power lines 1110 and the vias 1121 are formed under the power lines 1120. One power line 1110 may be provided with two or more vias 1111, and one power line 1120 may be provided with two or more vias 1121.

Although not depicted in the drawings, circuits, such as the power switch control circuit 52 depicted in FIG. 5, are connected between the power lines 1110 and the power lines 1120. As depicted in FIGS. 9 and 11, control signal lines 5110 for transmitting the outputs of the inverters 61 are positioned between the power lines 1110 and the power lines 1120 in plan view. The control signal lines 5110 extend in plan view up to a region between the first power domain 31A and the second power domain 31B. Grooves are formed in the substrate 11 below ends of the control signal lines 5110 at the second power domain 31B side and connection layers 5190 are formed in the grooves. The insulating layer 15 has vias 5111 formed therein to electrically connect the control signal lines 5110 and the connection layers 5190. The substrate 11 has vias 5191 formed therein to penetrate the substrate 11 up to the back side thereof. The vias 5191 are formed under the connection layers 5190.

[Second Power Domain 31B]

In the second power domain 31B, power lines 2110 extending in the X-direction and power lines 2120 extending in the X-direction are alternately arranged in the Y-direction. For example, the power lines 2110 correspond to VVDD interconnections and the power lines 2120 correspond to VSS interconnections.

As depicted in FIGS. 9-12, a plurality of grooves extending in the X-direction are formed in the substrate 11, and the power lines 2110 and 2120 are formed in these grooves. The power lines 2110 and 2120 of such structures may be referred to as BPR. A device separation film (not depicted) may be formed on the surface of the substrate 11.

The substrate 11 has vias 2111 and 2121 formed therein to penetrate the substrate 11 up to the back side thereof. The vias 2111 are formed under the power lines 2110 and the vias 2121 are formed under the power lines 2120. One power line 2110 may be provided with two or more vias 2111, and one power line 2120 may be provided with two or more vias 2121.

Although not depicted, circuits included in the standard cells 41, such as the inverters 70 depicted in FIG. 7, are connected between the power lines 2110 and the power lines 2120. SRAM memory cells may be connected between the power lines 2110 and the power lines 2120.

[Power Switch Circuit 42]

As depicted in FIGS. 9-12, the second chip 20 includes, for example, an insulating layer 25 and power lines 7110, 7120, 8110, and 8120 formed in a surface layer portion of the insulating layer 25. The power lines 7110, 7120, 8110, and 8120 extend in the X-direction.

The power lines 7110 and 7120 are provided in a region overlapping the first power domain 31A in plan view. The power lines 7110 correspond to VDD interconnections and the power lines 7120 correspond to VSS interconnections. In plan view, the power lines 7110 overlap the power lines 1110 and are connected to the power lines 1110 via vias 1111. In plan view, the power lines 7120 overlap the power lines 1120 and are connected to the power lines 1120 via vias 1121. As depicted in FIG. 11, power lines 7112 are provided below the power lines 7110, and the vias 7111 are provided connecting the power lines 7112 and the power lines 7110. As depicted in FIG. 12, power lines 7122 may be provided below the power lines 7120, and vias 7121 may be provided connecting the power lines 7122 and the power lines 7120. The power lines 7112 and 7122 may extend in the X-direction or may extend in the Y-direction. The power lines 7122 and the vias 7121 need not be provided.

The power lines 8110 and 8120 are provided in a region overlapping the second power domain 31B in plan view. The power lines 8110 correspond to VVDD interconnections and the power lines 8120 correspond to VSS interconnections. In plan view, the power lines 8110 overlap the power lines 2110 and are connected to the power lines 2110 via vias 2111. In plan view, the power lines 8120 overlap the power lines 2120 and are connected to the power lines 2120 via vias 2121. As depicted in FIG. 11, power lines 8112 may be provided below the power lines 8110, and vias 8111 may be provided connecting the power lines 8112 and the power lines 8110. As depicted in FIG. 12, power lines 8122 may be provided below the power lines 8120, and vias 8121 may be provided connecting the power lines 8122 and the power lines 8120. The power lines 8112 and 8122 may extend in the X-direction or may extend in the Y-direction.

The second chip 20 includes gate electrodes 5120 in the insulating layer 25. The gate electrodes 5120 are at positions lower than the power lines 7110, 7120, 8110, and 8120.

As depicted in FIGS. 9-12, the gate electrodes 5120 are positioned between the first power domain 31A and the second power domain 31B. Connection sections 5180 are formed in the surface layer portion of the insulating layer 25 above the gate electrodes 5120. The connection sections 5180 are connected to vias 5191. The insulating layer 25 has vias 5181 formed therein to electrically connect the gate electrodes 5120 to the connection sections 5180.

As depicted in FIGS. 9-12, a plurality of semiconductor layers 6110 overlapping the power lines 7110 and 8110 in plan view are formed in the insulating layer 25. The semiconductor layers 6110 are below the gate electrodes 5120, and gate insulating films 6120 are provided between the semiconductor layers 6110 and the gate electrodes 5120. The gate insulating films 6120 are in contact with the gate electrodes 5120, and the semiconductor layers 6110 are in contact with the gate insulating films 6120.

The semiconductor layers 6110 include VVDD connection sections 6111 (drains) and VDD connection sections 6112 (sources) on both sides of the centerlines of the semiconductor layers 6110 in the X-direction. The insulating layer 25 has vias 8113 formed therein to electrically connect the VVDD connection sections 6111 to the power lines 8110 and has vias 7113 formed therein to electrically connect the VDD connection sections 6112 to the power lines 7110. The plurality of semiconductor layers 6110 are arranged in the Y-direction.

The power lines 7110 are connected to the VDD connection sections 6112 via the vias 7113. The VVDD connection sections 6111 are connected to the power lines 2110 via the vias 8113, the power lines 8110, and the vias 2111. The power lines 7110 are supplied with the VDD potential, for example, via the power lines 7112 which are parts of the pads 23 (see FIG. 1). Also, as noted above, the power lines 2110 correspond to VVDD interconnections. Conductions between the VVDD connection sections 6111 and the VDD connection sections 6112 are thus controlled by the electric potentials of the gate electrodes 5120. That is, the gate electrodes 5120 function as the gates of the switch transistors 51 connected between the VDD interconnections and the VVDD interconnections.

Thus, in the present embodiment, the switch transistors 51 include the semiconductor layers 6110, and the semiconductor layers 6110 are positioned in plan view between the first power domain 31A and the second power domain 31B. That is, in plan view, the switch transistors 51 are positioned between the first power domain 31A and the second power domain 31B.

Generally speaking, a region for power isolation is provided between the first power domain 31A and the second power domain 31B. Therefore, according to the present embodiment, the size of the semiconductor device can be reduced compared to a case where the switch transistors 51 are disposed between the first power domain 31A and the second power domain 31B in the first chip 10 in addition to the region for power isolation (an isolation region).

The switch transistors 51 are disposed in an isolation region outside the second power domain 31B so that the connection layers 5190 of structures similar to BPR can be used to connect the control signal lines 5110 to the connection sections 5180.

The number of the vias 2111 and 2121 is not limited. The greater the number of the vias 2111 and 2121 are provided, the lower the resistances between the power lines 2110 and the power lines 8110 can be made, and the lower the resistances between the power lines 2120 and the power lines 8120 can be made. Thus, it is possible to reduce the IR drops.

The power lines 7112, 7122, 8112, and 8122 may extend in the Y-direction. The power line 8112 need not be provided.

In addition, the shape of each via in plan view is not particularly limited, and may be, for example, circular, elliptical, square, or rectangular.

Second Embodiment

Figure 13:
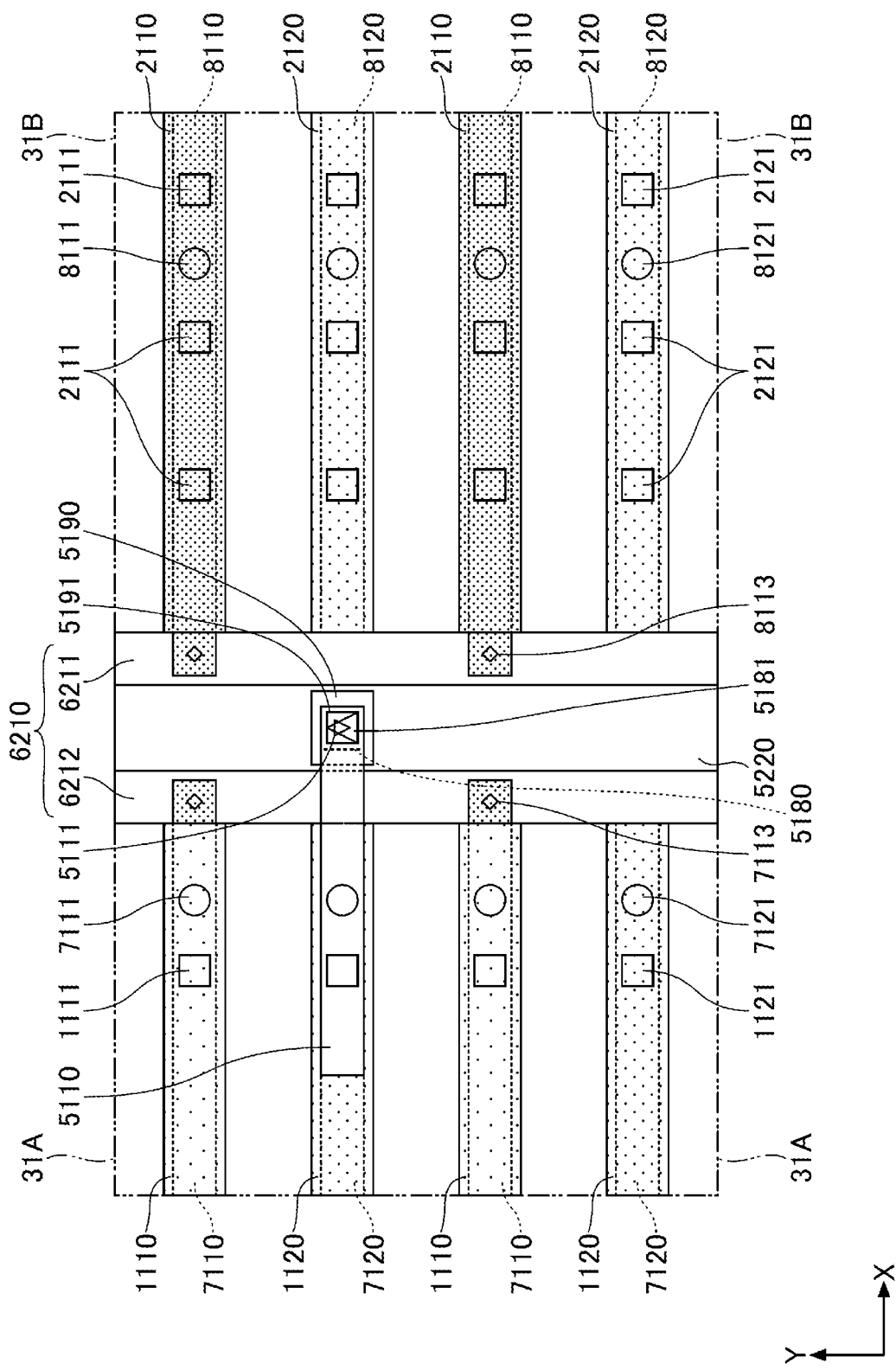
FIG. 13 is a schematic diagram depicting a configuration of a semiconductor device according to a second embodiment in plan view.

Next, a second embodiment will be described. The second embodiment differs from the first embodiment mainly in the arrangement of gate electrodes and the semiconductor films. FIG. 13 is a schematic diagram depicting a configuration of a semiconductor device according to the second embodiment in plan view.

In the second embodiment, a semiconductor layer 6210 is provided instead of the plurality of semiconductor layers 6110, as depicted in FIG. 13. The semiconductor layer 6210 overlaps the power lines 7110 and 8110 in plan view and extends in the Y-direction. Also, instead of the gate electrodes 5120, a gate electrode 5220 is provided which extends in the Y-direction above the semiconductor layer 6210. A gate insulating film (not depicted) is provided between the gate electrode 5220 and the semiconductor layer 6210 instead of the gate insulating films 6120. The gate insulating film is in contact with the gate electrode 5220, and the semiconductor layer 6210 is in contact with the gate insulating film.

The semiconductor layer 6210 includes a VVDD connection section 6211 and a VDD connection section 6212 on both sides of the centerline of the semiconductor layer 6210 in the X-direction. The insulating layer 25 includes vias 8113 electrically connecting the VVDD connection section 6211 to the power lines 8110, and vias 7113 electrically connecting the VDD connection section 6212 to the power lines 7110. For example, the plurality of power lines 8110 are connected to the one VVDD connection section 6211 via the plurality of vias 8113, and the plurality of power lines 7110 are connected to the one VDD connection section 6212 via the plurality of vias 7113.

The other configurations are the same as or similar to those of the first embodiment.

In the present embodiment, the switch transistor 51 includes the semiconductor layer 6210, and the semiconductor layer 6210 is positioned in plan view between the first and second power domains 31A and 31B. That is, in plan view, the switch transistor 51 is positioned between the first power domain 31A and the second power domain 31B.

Thus, as in the first embodiment, the size of the semiconductor device can be reduced. In addition the efficiency can be improved.

Third Embodiment

Figure 14:
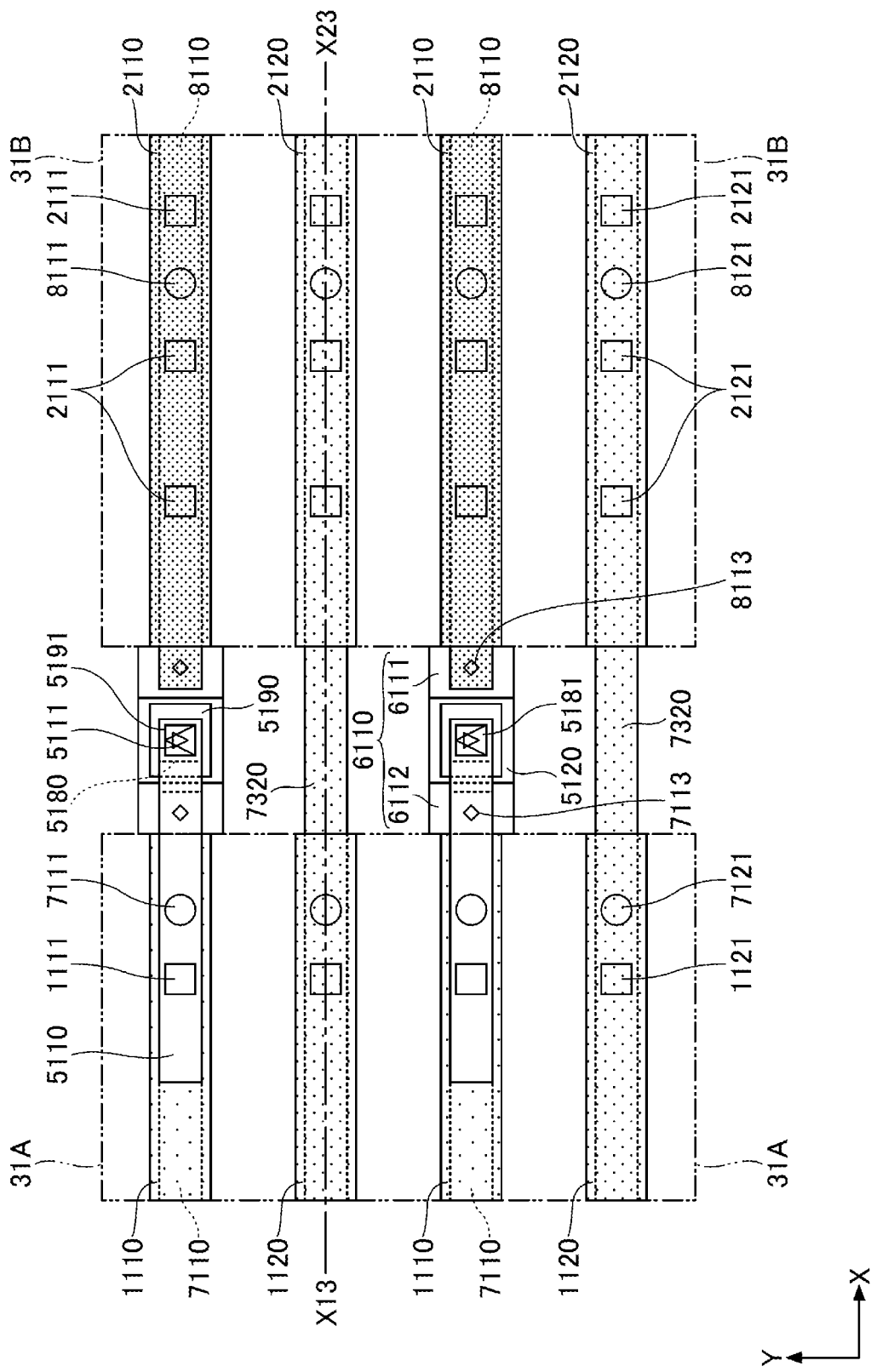
FIG. 14 is a schematic diagram depicting a configuration of a semiconductor device in plan view according to a third embodiment.
Figure 15:
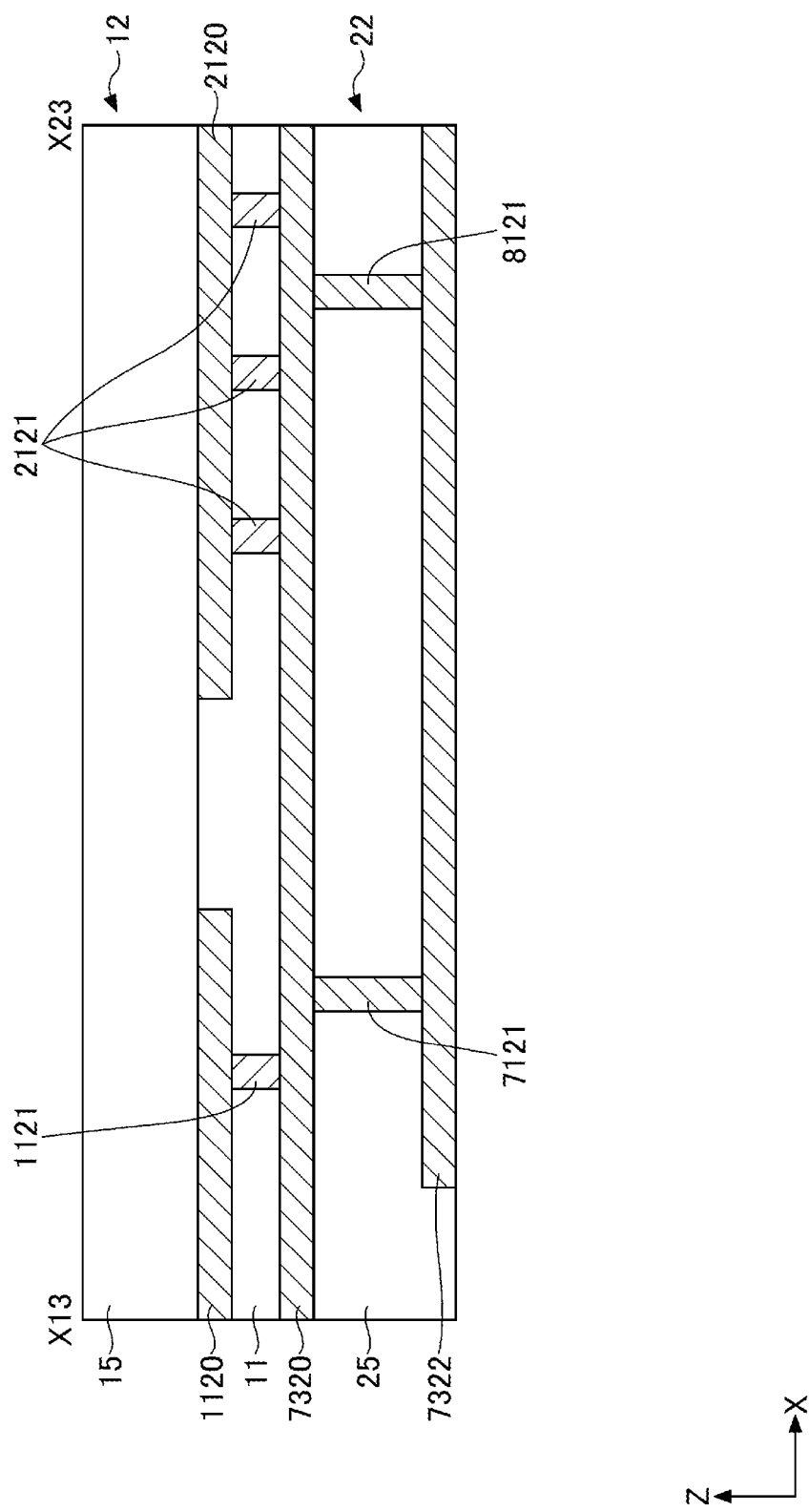
FIG. 15 is a cross-sectional diagram depicting the semiconductor device according to the third embodiment.

Next, a third embodiment will be described. The third embodiment is different from the first embodiment, etc., mainly in the arrangement of the VSS interconnections. FIG. 14 is a schematic diagram depicting a configuration of a semiconductor device according to the third embodiment in plan view. FIG. 15 is a cross-sectional diagram depicting the semiconductor device according to the third embodiment. FIG. 15 corresponds to a cross-sectional diagram taken along the X13-X23 line in FIG. 14.

In the third embodiment, as depicted in FIGS. 14 and 15, power lines 7320 are provided instead of the power lines 7120 and 8120. The power lines 7320 are provided in a surface layer portion of the insulating layer 25. The power lines 7320 extend in the X-direction.

The power lines 7320 are provided in plan view in a region that overlaps the first power domain 31A, a region that overlaps the second power domain 31B, and a region between these regions. The power lines 7320 correspond to VSS interconnections. The power lines 7320 overlap the power lines 1120 and 2120 in plan view and are connected to the power lines 1120 and 2120 via vias 1121 and 2121. As depicted in FIG. 15, power lines 7322 may be provided below the power lines 7320 instead of the power lines 7122 and 8122, and the power lines 7322 may be connected to the power lines 7320 via vias 7121 and 8121.

The other configurations are the same as or similar to those of the first embodiment.

The third embodiment can have the same advantageous effects as those of the first embodiment. In the third embodiment, because the VSS interconnections are shared between the first power domain 31A and the second power domain 31B, power source noise generated in the VDD interconnections can be reduced.

Fourth Embodiment

Figure 16:
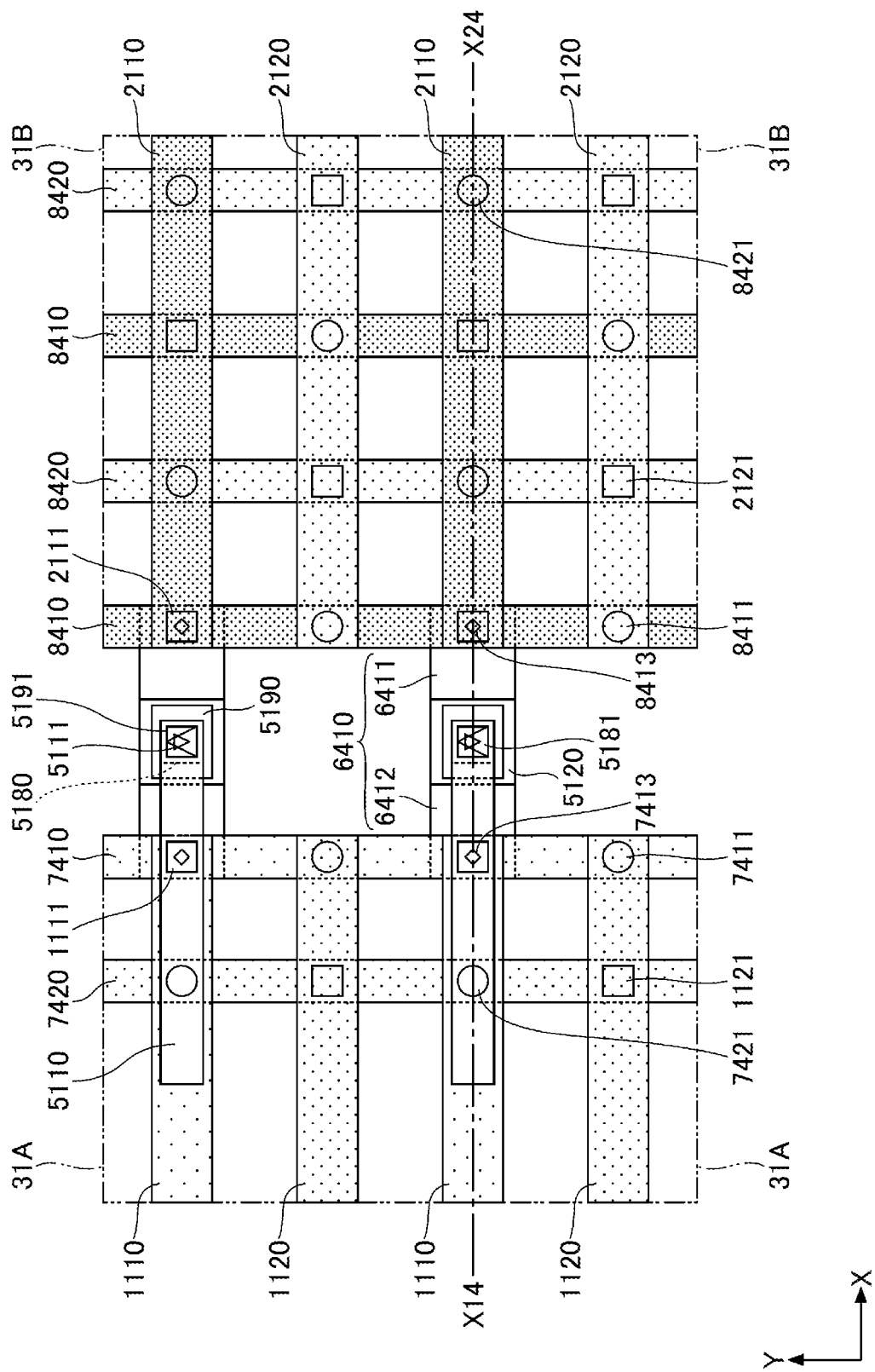
FIG. 16 is a schematic diagram depicting a configuration of a semiconductor device according to a fourth embodiment in plan view.
Figure 17:
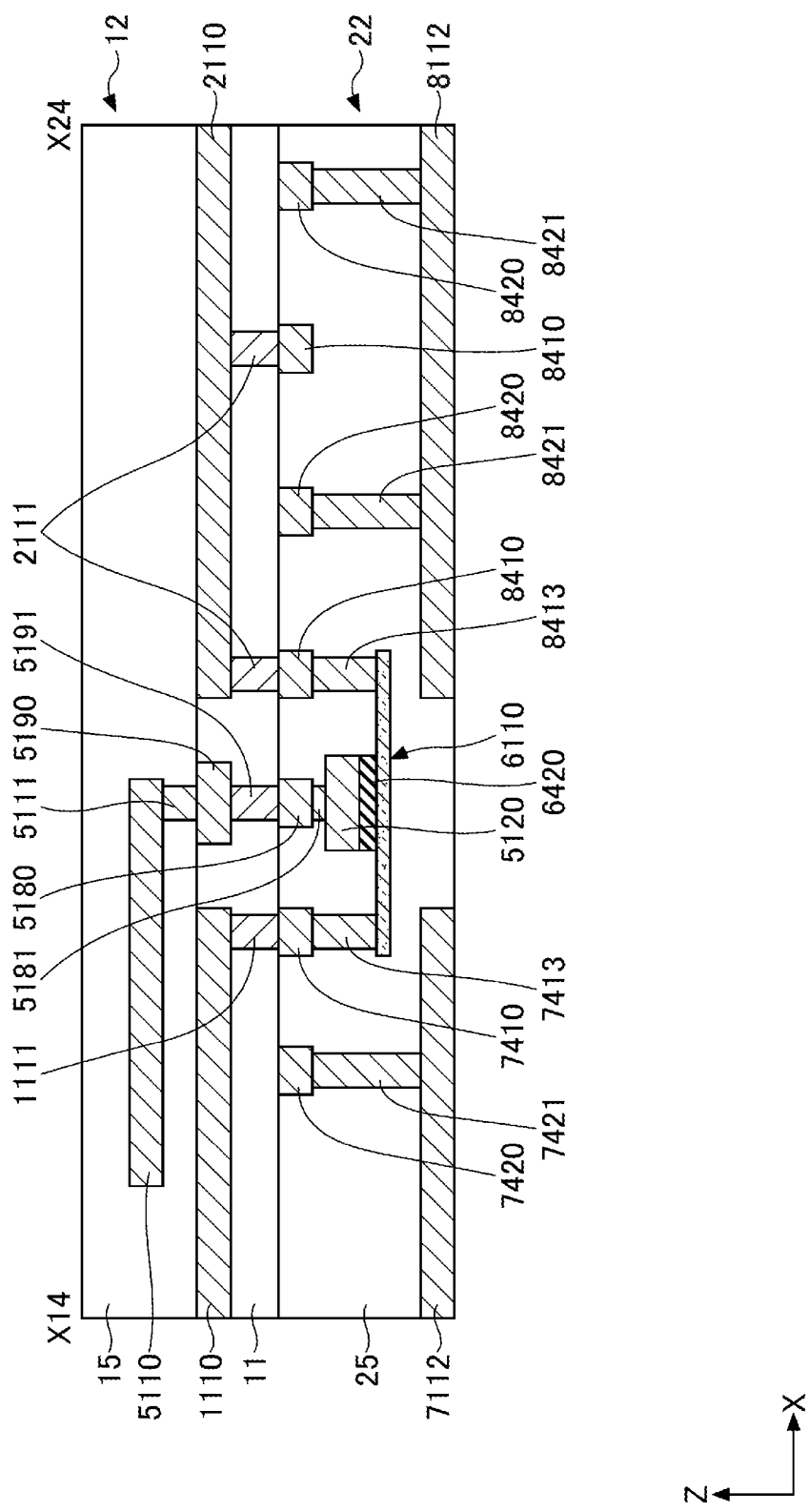
FIG. 17 is a cross-sectional diagram depicting the semiconductor device according to the fourth embodiment.

Next, a fourth embodiment will be described. The fourth embodiment is different from the first embodiment, etc., mainly in the arrangement of the power lines. FIG. 16 is a schematic diagram depicting a configuration of a semiconductor device according to the fourth embodiment in plan view. FIG. 17 is a cross-sectional diagram depicting the semiconductor device according to the fourth embodiment. FIG. 17 corresponds to a cross-sectional diagram taken along the X14-X24 line in FIG. 16.

In the fourth embodiment, power lines 7410, 7420, 8410, and 8420 are provided instead of the power lines 7110, 7120, 8110 and 8120, as depicted in FIGS. 16 and 17. The power lines 7410, 7420, 8410, and 8420 are provided in a surface layer portion of the insulating layer 25. The power lines 7410, 7420, 8410, and 8420 extend in the Y-direction.

The power lines 7410 and 7420 are provided in regions overlapping the first power domain 31A in plan view. The power line 7410 corresponds to a VDD interconnection and the power line 7420 corresponds to a VSS interconnection. In plan view, the power line 7410 is perpendicular to the power lines 1110 and 1120 and is connected to the power lines 1110 via vias 1111. In plan view, the power line 7420 is perpendicular to the power lines 1110 and 1120 and is connected to the power lines 1120 via vias 1121. As depicted in FIG. 17, power lines 7112 may be provided below the power lines 1110, and vias 7421 may be provided connecting the power lines 7112 and the power line 7420. Power lines (not depicted) corresponding to VDD interconnections are provided at positions below the power lines 1120, and vias 7411 are provided connecting the power lines to the power line 7410, as depicted in FIG. 16. The power lines 1110 and 7410 have mesh structures in plan view. The power lines 1120 and 7420 have mesh structures in plan view.

The power lines 8410 and 8420 are provided in regions overlapping the second power domain 31B in plan view. The power lines 8410 correspond to VVDD interconnections and the power lines 8420 correspond to VSS interconnections. In plan view, the power lines 8410 is perpendicular to the power lines 2110 and 2120 and are connected to the power lines 2110 via vias 2111. In plan view, the power lines 8420 are perpendicular to the power lines 2110 and 2120 and are connected to the power lines 2120 via vias 2121. As depicted in FIG. 17, power lines 8112 may be provided below the power lines 2110 and vias 8421 may be provided connecting the power lines 8112 and the power lines 8420. Power lines (not depicted) corresponding to VVDD interconnections are provided below the power lines 2120 and vias 8411 are provided connecting the power lines to the power lines 8410, as depicted in FIG. 16. The power lines 2110 and 8410 have mesh structures in plan view. The power lines 2120 and 8420 have mesh structures in plan view.

The other configurations are the same as or similar to those of the first embodiment.

Also the fourth embodiment can have the same advantageous effects as those of the first embodiment. The plurality of power lines 1110 may be connected in common to the VDD connection section 6412 of each switch transistor 51, and the plurality of power lines 2110 may be connected in common to the VVDD connection section 6411 of each switch transistor 51. Also the power may be distributed again via the power lines 7112 and 8112, or the like.

The number of each of the power lines 7410, 7420, 8410, and 8420 is not limited. In a case where a plurality of power lines 7410 are used, the width of the power line 7410 connected to the VDD connection sections 6412 via the vias 7413 from among the plurality of power lines 7410 may be greater than the width of each of the other power lines 7410. In a case where a plurality of power lines 8410 are used, the width of the power line 8410 connected to the VVDD connection sections 6411 via the vias 8413 from among the plurality of power lines 8410 may be greater than the width of each of the other power lines 8410.

Fifth Embodiment

Figure 18:
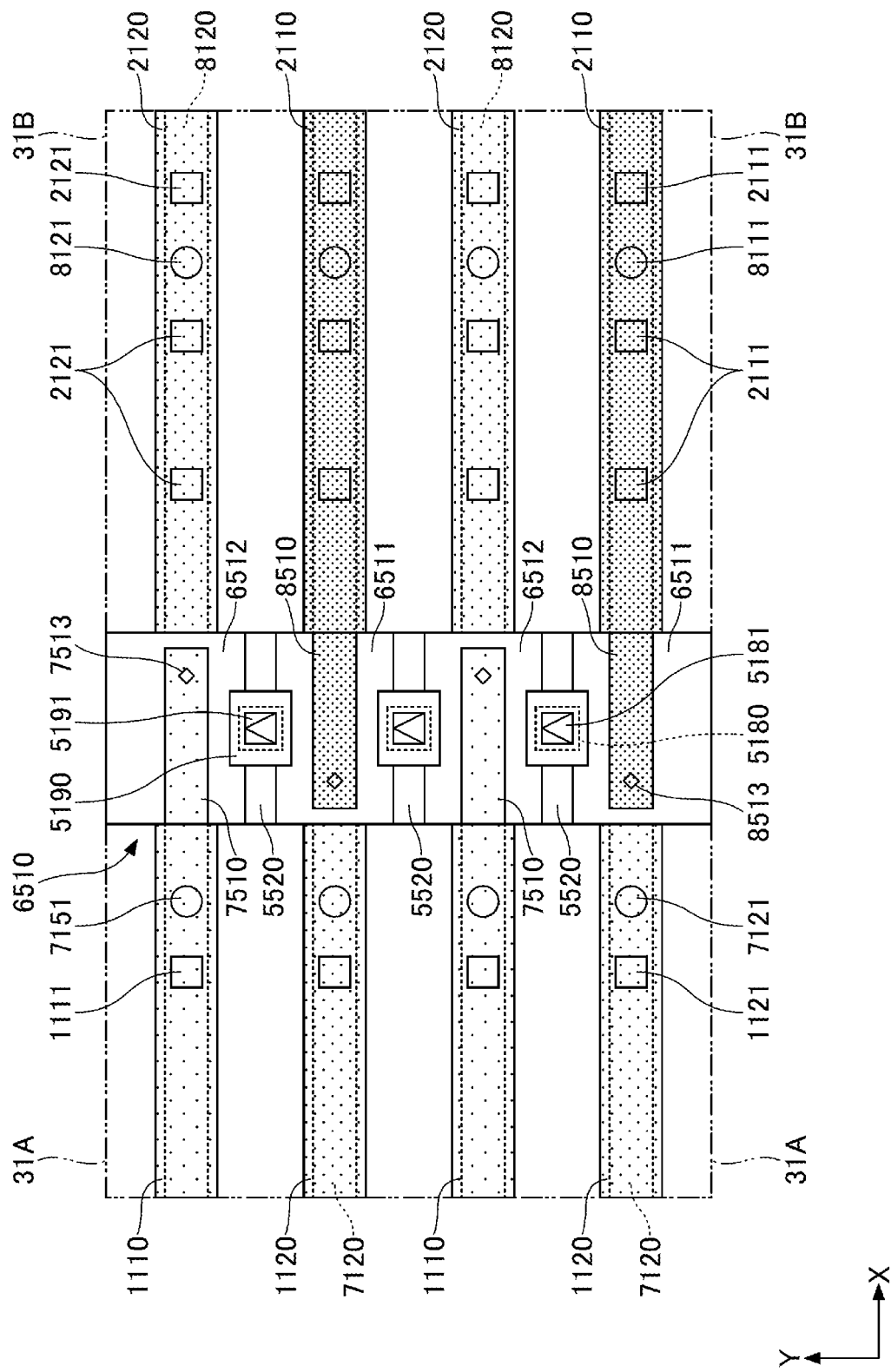
FIG. 18 is a schematic diagram depicting a configuration of a semiconductor device according to a fifth embodiment in plan view.

Next, a fifth embodiment will be described. The fifth embodiment is different from the first embodiment, etc., mainly in the arrangement of power lines, gate electrodes, and semiconductor films. FIG. 18 is a schematic diagram depicting a configuration of a semiconductor device according to the fifth embodiment in plan view. In FIG. 18, the portions corresponding to the control signal lines 5110 are omitted.

In the fifth embodiment, as depicted in FIG. 18, the plurality of semiconductor layers 6110 are replaced by a semiconductor layer 6510, the power lines 7110 are replaced by power lines 7510, and the power lines 8110 are replaced by power lines 8510. The power lines 7510 correspond to VDD interconnections and the power lines 8510 correspond to VVDD interconnections.

The power lines 7510 are provided in regions that overlap the first power domain 31A in plan view, similar to the power lines 7110. The power lines 7510 further extend between the first and second power domains 31A and 31B to near the power lines 8120. The power lines 8510 are provided in regions that overlap the second power domain 31B in plan view, similar to the power lines 8110. The power lines 8510 further extend between the first and second power domains 31A and 31B to near the power lines 7120. Then, the power lines 7510 and 8510 overlap with each other in a view of the Y-direction.

The semiconductor layer 6510 overlaps the power lines 7510 and 8510 in plan view and extends in the Y-direction. Gate electrodes 5520 are provided and extend in the X-direction above the semiconductor layer 6510 instead of the gate electrodes 5120. The gate electrodes 5520 are positioned between ends of the power lines 7510 at the power line 8120 side and ends of the power lines 8510 at the power line 7120 side, which are next to each other in the Y-direction. The semiconductor layer 6510 has VDD connection sections 6512 around ends of the power lines 7510 at the power line 8120 side in plan view and VVDD connection sections 6511 around ends of the power lines 8510 at the power line 7120 side in plan view. Gate insulating films (not depicted) are provided between the gate electrodes 5520 and the semiconductor layer 6510 instead of the gate insulating films 6120. The gate insulating films are in contact with the gate electrodes 5520, and the semiconductor layer 6510 is in contact with the gate insulating films. The insulating layer 25 has vias 8513 formed therein to electrically connect the VVDD connection sections 6511 to the power lines 8510 and has vias 7513 formed therein to electrically connect the VDD connection sections 6512 to the power lines 7510.

The other configurations are the same as or similar to those of the first embodiment.

Also the fifth embodiment can have the same advantageous effects as the first embodiment.

Sixth Embodiment

Figure 19:
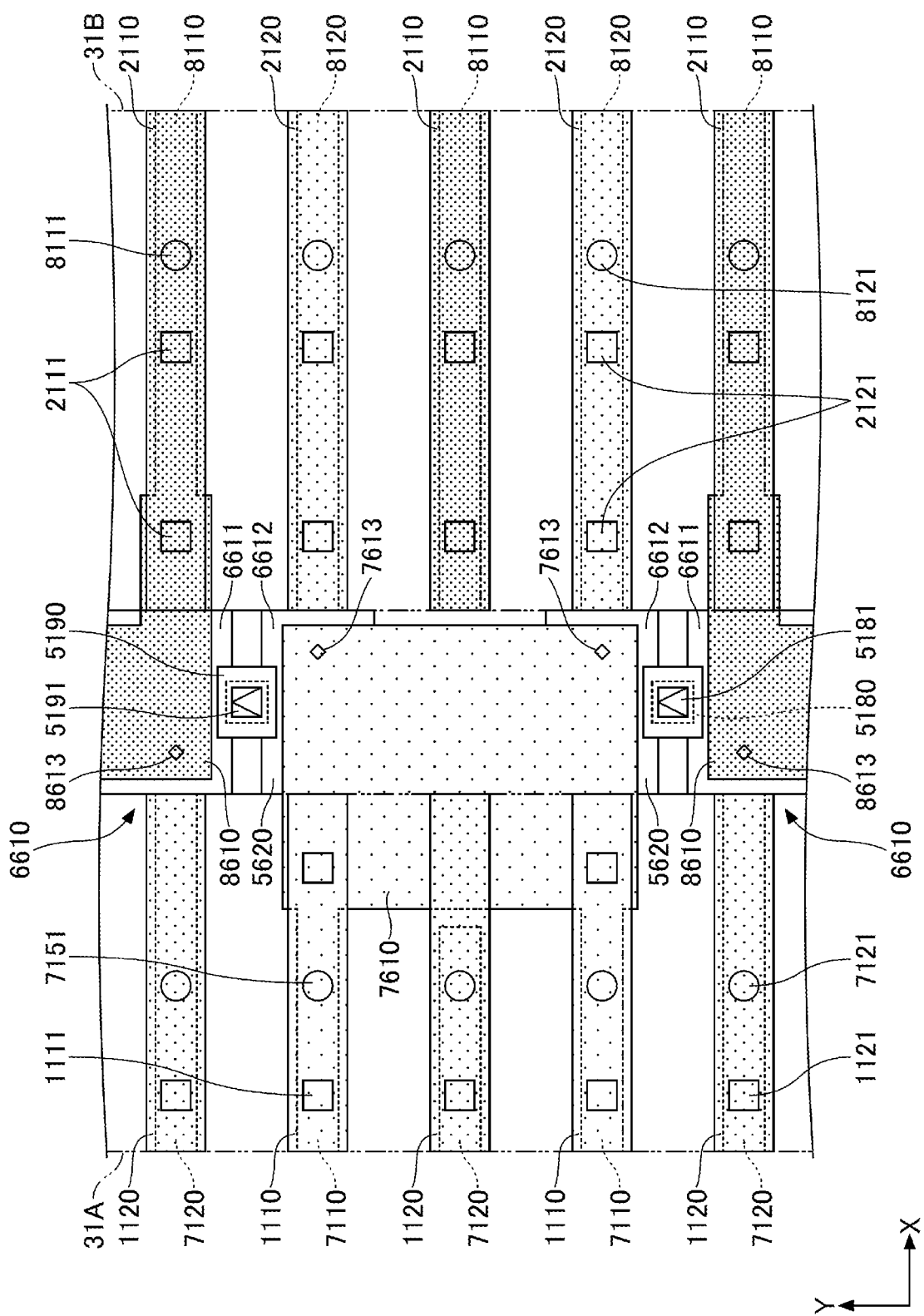
FIG. 19 is a schematic diagram depicting a configuration of a semiconductor device according to a sixth embodiment in plan view.

Next, a sixth embodiment will be described. The sixth embodiment is different from the first embodiment, etc., mainly in the arrangement of power lines, gate electrodes, and semiconductor films. FIG. 19 is a schematic diagram depicting a configuration of a semiconductor device according to the sixth embodiment in plan view. In FIG. 19, the portions corresponding to the control signal lines 5110 are omitted.

In the sixth embodiment, as depicted in FIG. 19, there is a common connection section 7610 that is connected in common to two power lines 7110 next to each other with one power line 7120 inserted therebetween in the Y-direction. The common connection section 7610 is connected to an end of the power line 7110 at the second power domain 31B side and extends to a region between the first power domain 31A and the second power domain 31B in plan view. For example, an end of the common connection section 7610 at the second power domain 31B side is positioned near the second power domain 31B. The power line 7120 between the two power lines 7110 connected to the common connection section 7610 is apart in the X-direction from the common connection section 7610.

A common connection section 8610 is provided that is connected in common to two power lines 8110 next to each other with a single power line 8120 inserted therebetween in the Y-direction. The common connection section 8610 is connected to an end of the power line 8110 at the first power domain 31A side and extends to the region between the first power domain 31A and the second power domain 31B in plan view. For example, an end of the common connection section 8610 at the first power domain 31A side is positioned near the first power domain 31A. The power line 8120 between the two power lines 8110 connected to the common connection section 8610 is apart in the X-direction from the common connection section 8610.

Semiconductor layers 6610 are provided instead of the semiconductor layers 6110. Each semiconductor layer 6610 is positioned to overlap a portion of the common connection section 8610 and a portion of the common connection section 7610 arranged next to each other in the Y-direction. Gate electrodes 5620 are provided extending in the X-direction above the semiconductor layers 6610 instead of the gate electrodes 5120. The gate electrodes 5620 are positioned between the common connection sections 8610 and the common connection sections 7610 arranged next to each other in the Y-direction. The semiconductor layers 6610 include VDD connection sections 6612 around the common connection sections 7610 in plan view and include VVDD connection sections 6611 around the common connection sections 8610 in plan view. Gate insulating films (not depicted) are provided between the gate electrodes 5620 and the semiconductor layers 6610 instead of the gate insulating films 6120. The gate insulating films are in contact with the gate electrodes 5620, and the semiconductor layers 6610 are in contact with the gate insulating films. The insulating layer 25 has vias 8613 formed therein to electrically connect the VVDD connection sections 6611 and the common connection sections 8610 and vias 7613 formed therein to electrically connect the VDD connection sections 6612 and the common connection sections 7610.

Thus, in the sixth embodiment, each common connection section 7610 is connected to the VDD connection sections 6612 of two switch transistors 51, and each common connection section 8610 is connected to the VVDD connection sections 6611 of two switch transistors 51.

The other configurations are the same as or similar to those of the first embodiment.

The sixth embodiment can have the same advantageous effects as those of the first embodiment.

Seventh Embodiment

Figure 20:
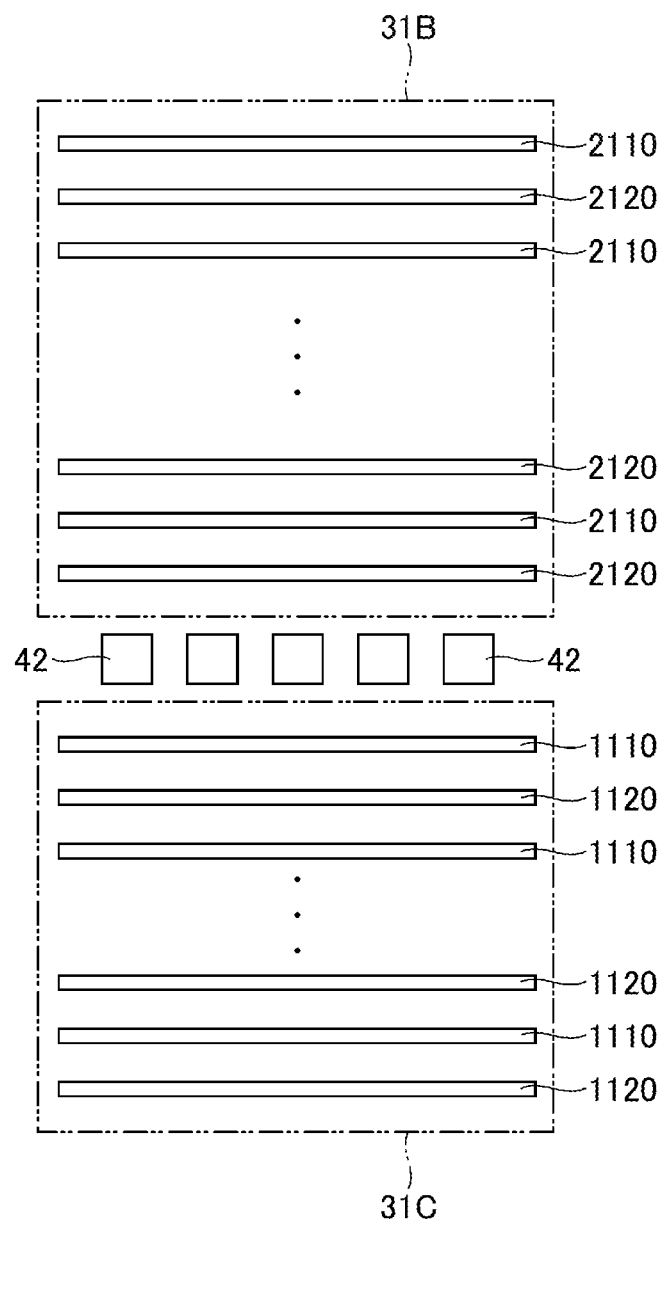
FIG. 20 is a schematic diagram depicting an outline of power domains in a seventh embodiment.
Figure 21:
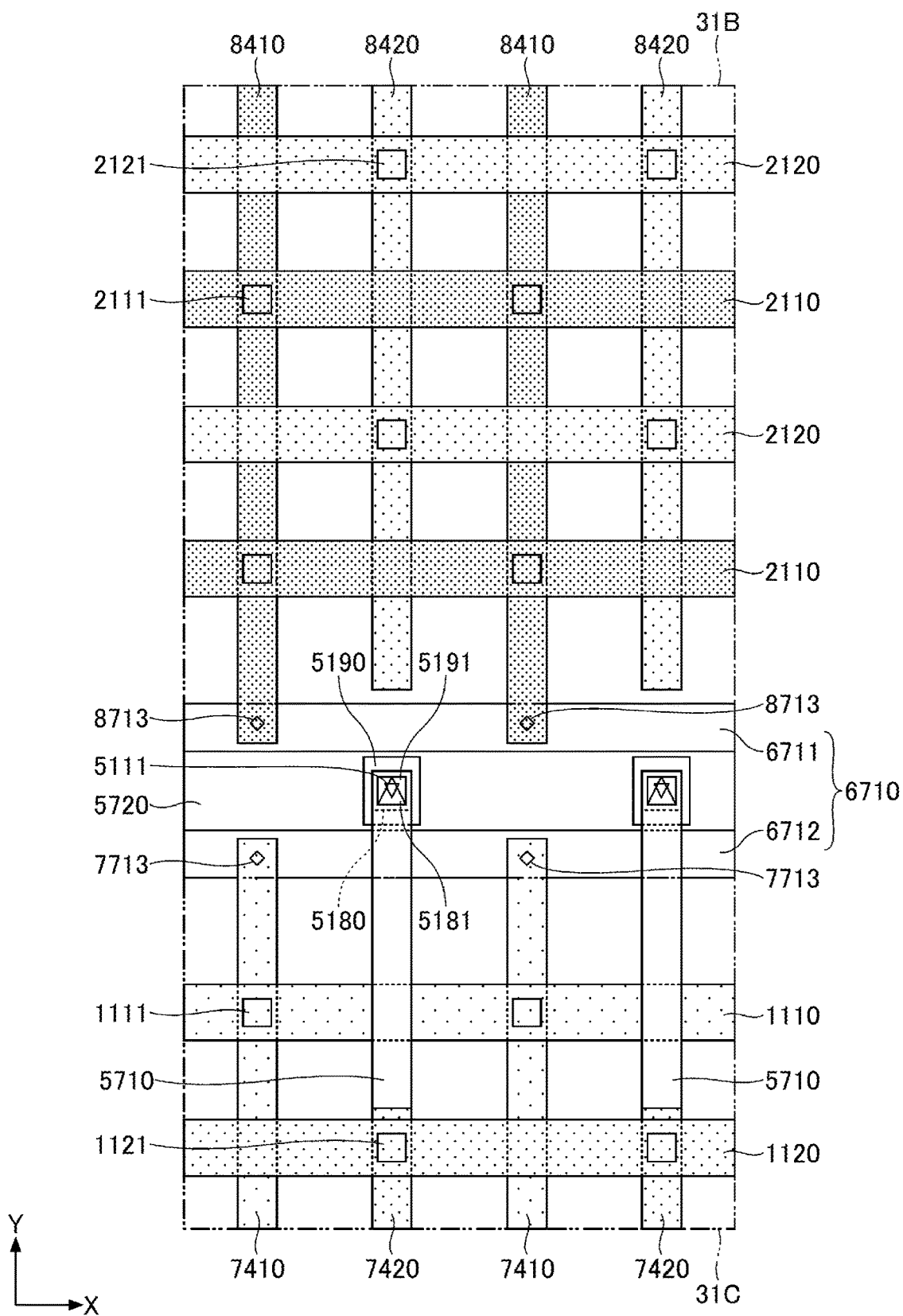
FIG. 21 is a schematic diagram depicting a configuration of the semiconductor device according to the seventh embodiment in plan view.

Next, a seventh embodiment will be described. The seventh embodiment is different from the first embodiment, etc., mainly in the arrangement of the power domains and the layout of the power switch circuits. FIG. 20 is a schematic diagram depicting an outline of the power domains in the seventh embodiment. FIG. 21 is a schematic diagram depicting a configuration of the semiconductor device according to the seventh embodiment in plan view.

In the seventh embodiment, for example, as depicted in FIG. 20, a third power domain 31C is provided in the direction opposite to the Y-direction with respect to the second power domain 31B. The third power domain 31C includes circuits connected to the power lines 1110 and 1120, as in the first power domain 31A. Power switch circuits 42 are provided between the third power domain 31C and the second power domain 31B. At least a portion of the third power domain 31C and the second power domain 31B may be arranged along a direction perpendicular to the extending direction of the power lines 1110 and the power lines 2110, as depicted in FIG. 20, in a case where the second power domain 31B is surrounded by the third power domain 31C, for example.

As depicted in FIG. 21, the second power domain 31B is provided with power lines 2110, 2120, 8410, 8420, and the like. The third power domain 31C is provided with power lines 1110, 1120, 7410, 7420, and the like. Control signal lines 5710 extending in the Y-direction are also provided instead of the control signal lines 5110. The control signal lines 5710 are connected to connection layers 5190 via vias 5111 (see FIG. 11). The power lines 7410, 7420, 8410 and 8420 are provided in a surface layer portion of the insulating layer 25 and extend in the Y-direction, similar to the fourth embodiment.

A semiconductor layer 6710 is provided between the second power domain 31B and the third power domain 31C. The semiconductor layer 6710 overlaps the power lines 7410 and 8410 in plan view and extends in the X-direction. A gate electrode 5720 is provided and extends in the X-direction above the semiconductor layer 6710. A gate insulating film (not depicted) is provided between the gate electrode 5720 and the semiconductor layer 6710. The gate insulating film is in contact with the gate electrode 5720, and the semiconductor layer 6710 is in contact with the gate insulating film.

The semiconductor layer 6710 has a VVDD connection section 6711 and a VDD connection section 6712 on both sides of the centerline of the semiconductor layer 6710 in the Y-direction. The insulating layer 25 has vias 8713 formed therein to electrically connect the VVDD connection section 6711 and the power lines 8410 and vias 7713 formed therein to electrically connect the VDD connection section 6712 and the power lines 7410. For example, the plurality of power lines 8410 are connected to the one VVDD connection section 6711 via the plurality of vias 8713 and the plurality of power lines 7410 are connected to the one VDD connection section 6712 via the plurality of vias 7713.

The other configurations are the same as or similar to those of the first embodiment.

Also the seventh embodiment can have the same advantageous effects as those of the first embodiment.

The configurations of the switch transistors 51 provided in the seventh embodiment are similar to the configurations of the switch transistors 51 in the second embodiment. The configurations of the switch transistors 51 provided between the second power domain 31B and the third power domain 31C may be the same as or similar to those of the switch transistors 51 in any other embodiment. Each power line need not be provided in a surface layer portion of the insulating layer 25, but may be provided in the inside of the insulating layer 25. Further, the power lines provided in the surface layer portion of the insulating layer 25 may extend in the X-direction.

The first power domain 31A may be provided in addition to the second and third power domains 31B and 31C, and the power switch circuits 42 may be provided between the first and second power domains 31A and 31B and between the second and third power domains 31B and 31C.

Eighth Embodiment

Figure 22:
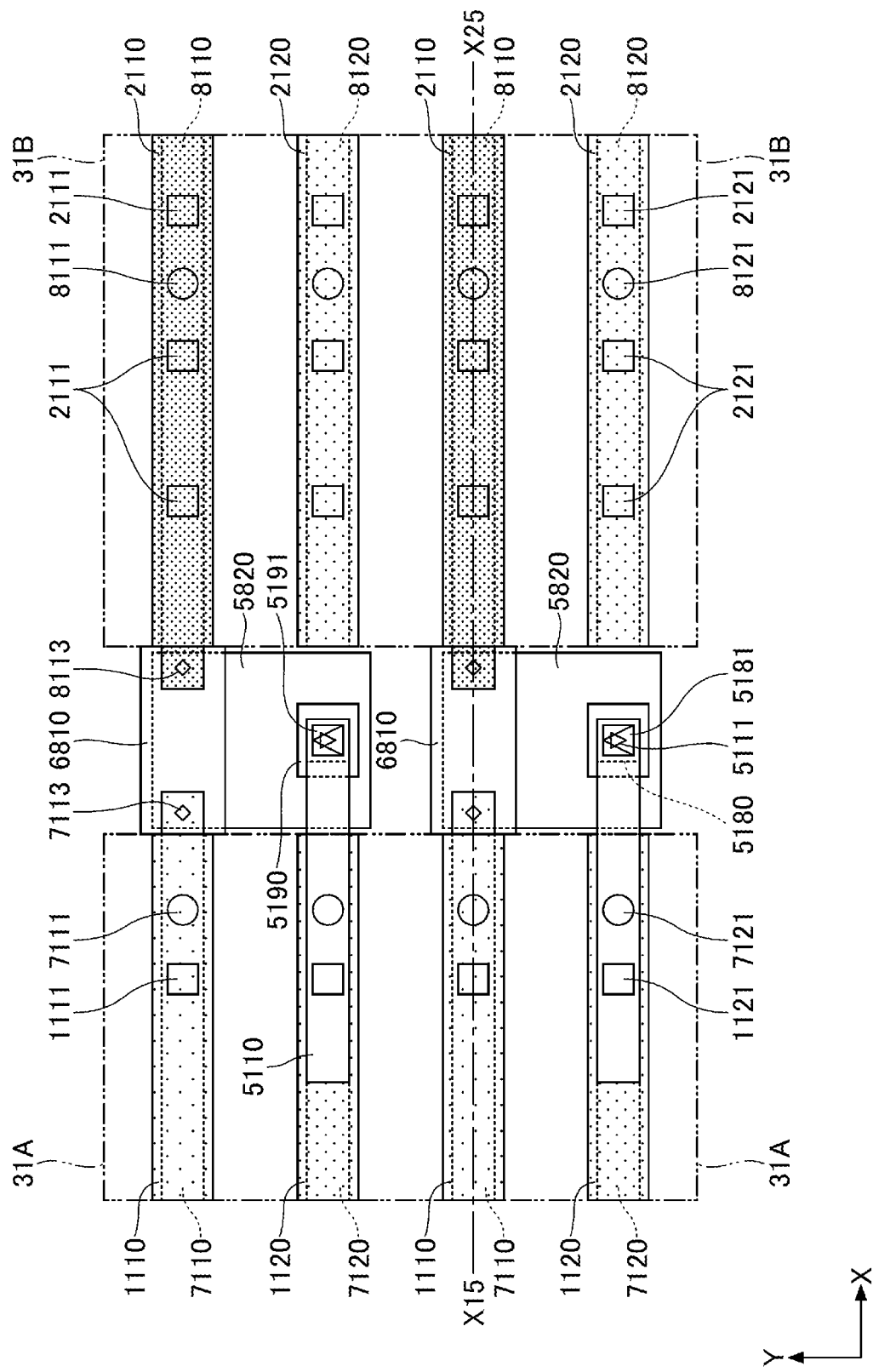
FIG. 22 is a schematic diagram depicting a configuration of a semiconductor device according to an eighth embodiment in plan view.
Figure 23:
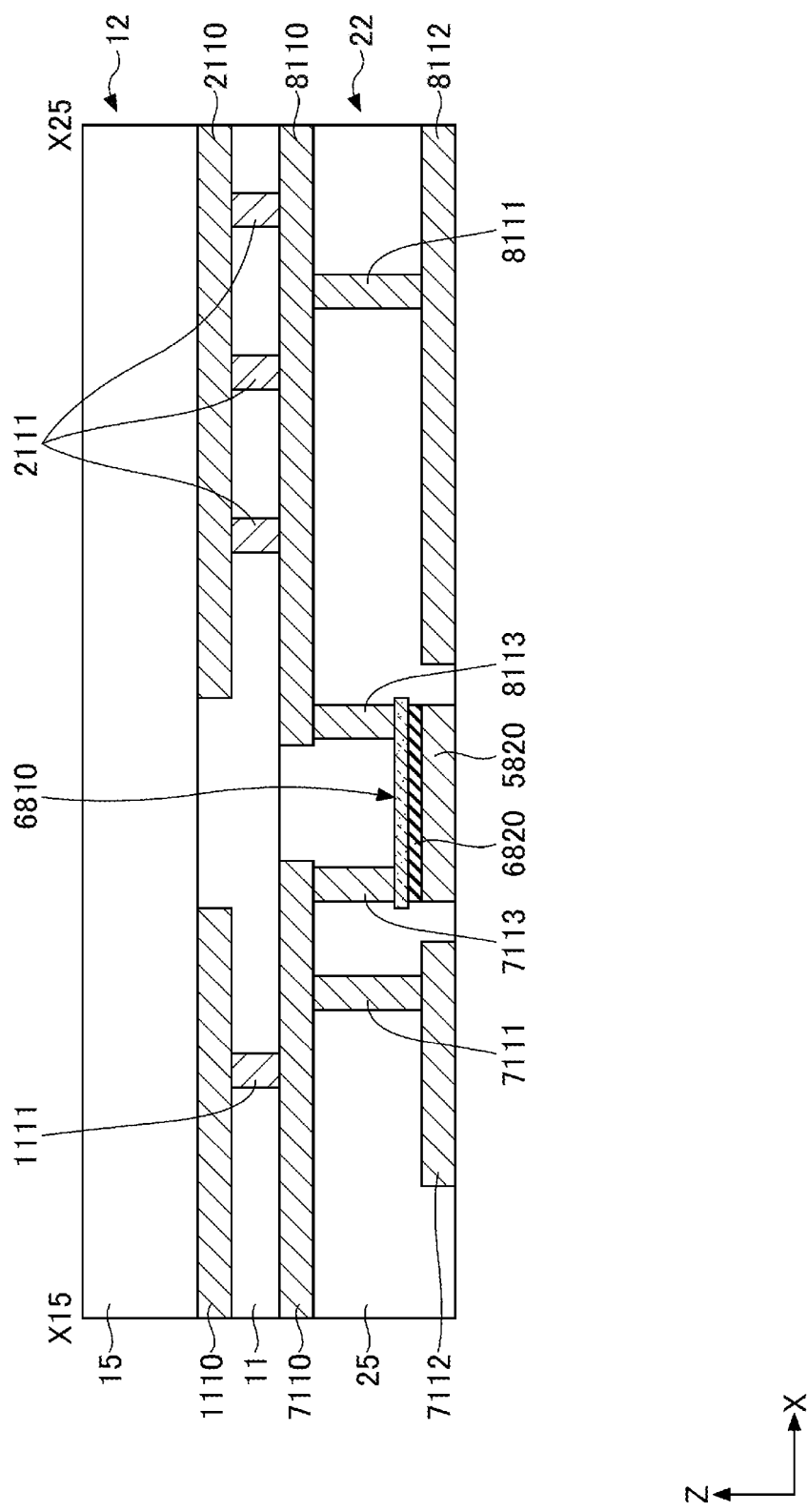
FIG. 23 is a cross-sectional diagram depicting the semiconductor device according to the eighth embodiment.

Next, an eighth embodiment will be described. The eighth embodiment differs from the first embodiment, etc., mainly in the configuration of the switch transistors. FIG. 22 is a schematic diagram depicting a configuration of a semiconductor device according to the eighth embodiment in plan view. FIG. 23 is a cross-sectional diagram depicting the semiconductor device according to the eighth embodiment. FIG. 23 corresponds to a cross-sectional diagram taken along the X15-X25 line in FIG. 22.

In the eighth embodiment, semiconductor layers 6810 are provided instead of the semiconductor layers 6110, as depicted in FIGS. 22 and 23. The semiconductor layers 6810 overlap the power lines 7110 and 8110 in plan view. Gate electrodes 5820 are provided below the semiconductor layers 6210 instead of the gate electrodes 5120. Between the gate electrodes 5820 and the semiconductor layers 6810 are gate insulating films 6820 instead of the gate insulating films 6120. The gate insulating films 6820 are in contact with the gate electrodes 5820, and the semiconductor layers 6810 are in contact with the gate insulating films 6820.

The other configurations are the same as or similar to those of the first embodiment.

Also the eighth embodiment can have the same advantageous effects as those of the first embodiment.

The gate electrodes 5820 may be formed in the same layer as the power lines 7112 and 8112, etc. The gate electrodes 5820 may be formed of the same material as the power lines 7112 and 8112, etc. The control signal lines 5110 may extend in the Y-direction and be connected to the plurality of gate electrodes 5820 via the plurality of vias 5111 or the like.

Also in the other embodiments, the gate electrodes and the gate insulating films may be at positions lower than the semiconductor layers.

Ninth Embodiment

Figure 24:
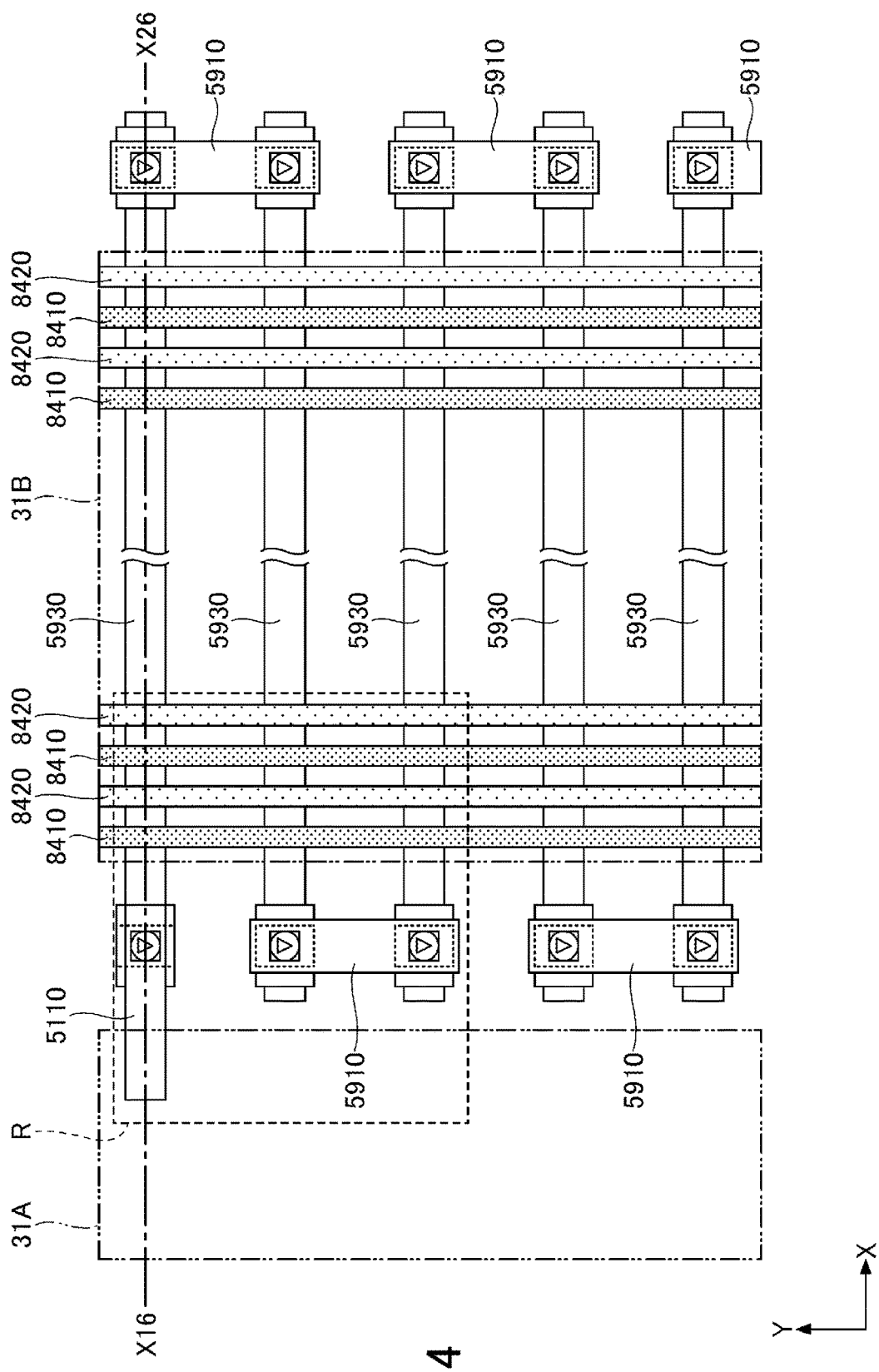
FIG. 24 is a schematic diagram depicting an outline of a configuration of a semiconductor device according to a ninth embodiment in plan view.
Figure 25:
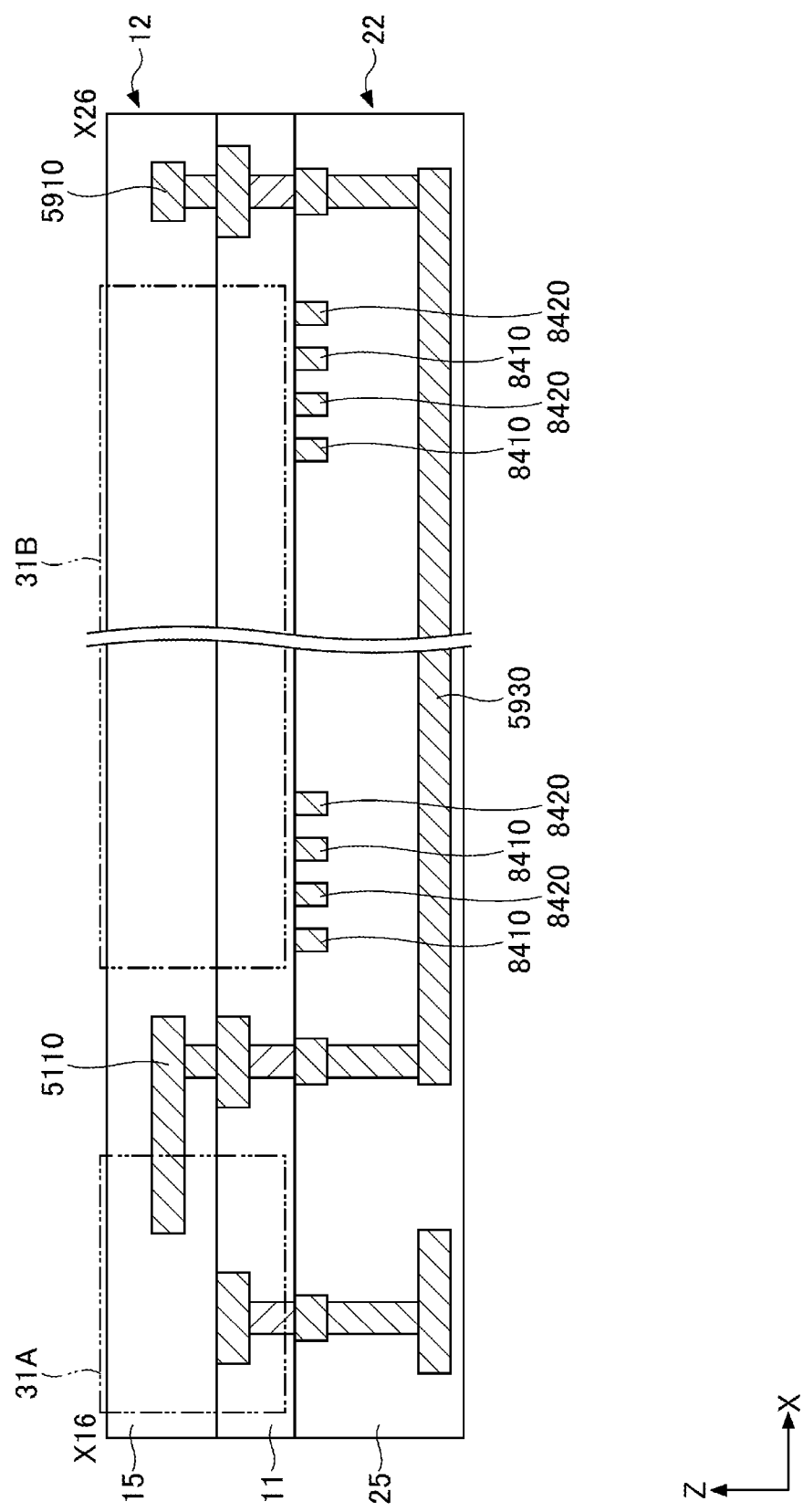
FIG. 25 is a cross-sectional diagram depicting an outline of the semiconductor device according to the ninth embodiment.

Next, a ninth embodiment will be described. The ninth embodiment differs from the first embodiment, etc., in the arrangement of control signal lines. FIG. 24 is a schematic diagram depicting a configuration of a semiconductor device according to the ninth embodiment in plan view. FIG. 25 is a cross-sectional diagram depicting the semiconductor device according to the ninth embodiment. FIGS. 24 and 25 in particular depict portions of the arrangement of control signal lines, and omit the semiconductor layers, some power lines and vias, and the like.

In the ninth embodiment, a plurality of control signal lines 5930 are disposed in the insulating layer 25, as depicted in FIGS. 24 and 25. The control signal lines 5930 extend in the X-direction and are arranged side by side in the Y-direction. Each control signal line 5930 has a portion extending beyond both ends of the second power domain 31B in the X-direction. The control signal lines 5930 arranged next to each other in the Y-direction are connected to each other via control signal lines 5910 extending in the Y-direction outside of the second power domain 31B. The control signal line 5930 connected at the side in the direction opposite to the X-direction via the control signal line 5910 to the control signal line 5930 that is immediately next thereto in the Y-direction is connected at the side in the X-direction via the control signal line 5910 to the control signal line 5930 that is immediately next thereto in the direction opposite to the Y-direction. In the same way, the control signal line 5930 connected at the side in the X-direction via the control signal line 5910 to the control signal line 5930 that is immediately next thereto in the Y-direction is connected at the side in the direction opposite to the X-direction via the control signal line 5910 to the control signal line 5930 that is immediately next thereto in the direction opposite to the Y-direction.

Thus, in the present embodiment, a continuous body made of the control signal line 5110, the control signal line 5930, the control signal line 5910, the control signal line 5930, the control signal line 5910, ..., is serpentine in plan view. The control signal lines 5930 next to each other in the Y-direction are connected to each other only on the outside of the second power domain 31B. The gate electrodes (not depicted) of the switch transistors 51 are connected to the control signal lines 5910, as will be described in detail later. That is, the plurality of switch transistors 51 are connected in parallel.

Figure 26:
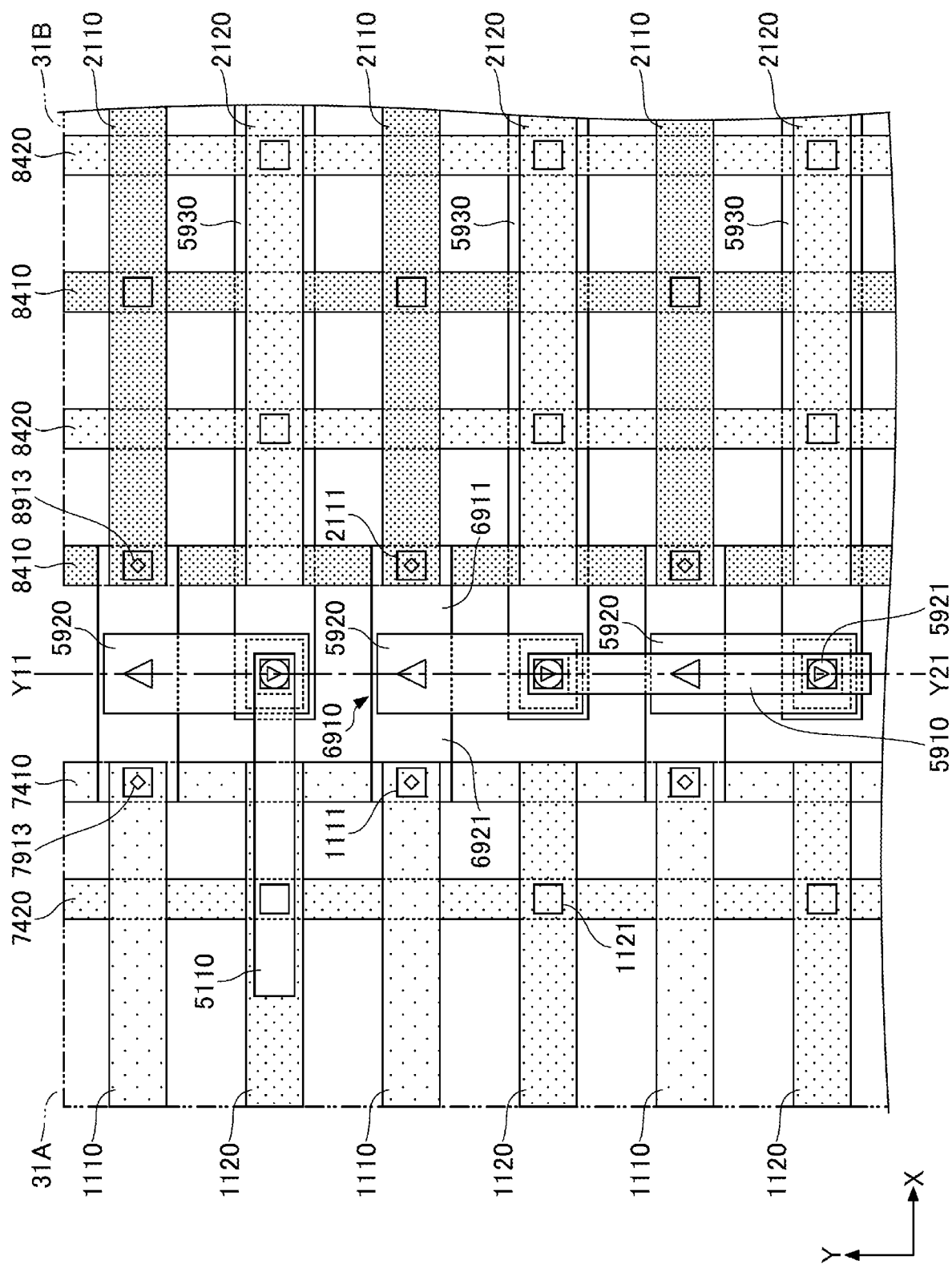
FIG. 26 is a schematic diagram depicting a configuration of the semiconductor device according to the ninth embodiment in plan view.
Figure 27:
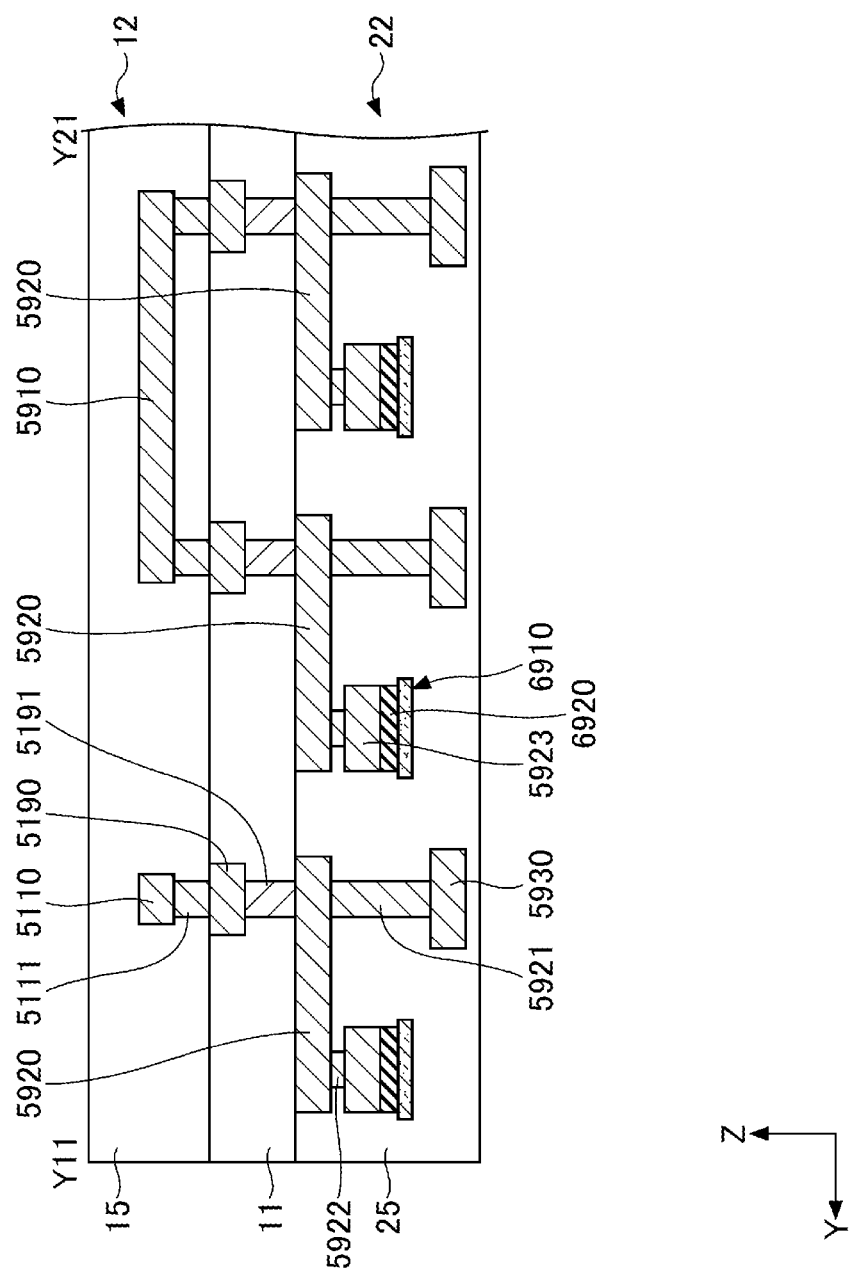
FIG. 27 is a cross-sectional diagram depicting a configuration of the semiconductor device according to the ninth embodiment.

Hereinafter, a detailed configuration of a region R in FIG. 24 will be described. FIG. 26 is a schematic diagram depicting a configuration of the semiconductor device according to the ninth embodiment in plan view. FIG. 27 is a cross-sectional diagram depicting a configuration of the semiconductor device according to the ninth embodiment. FIG. 27 corresponds to a cross-sectional diagram taken along the Y11-Y21 line in FIG. 26.

As depicted in FIGS. 26 and 27, the control signal lines 5930 extend in the X-direction at positions lower than the semiconductor layers 6910. Connection sections 5920 are provided in a surface layer portion of the insulating layer 25 at positions overlapping the control signal lines 5110 or 5910 in plan view. Vias 5921 are provided and electrically connect the control signal lines 5930 and the connection sections 5920. Below the connection sections 5920 are vias 5922 in addition to the vias 5921. Gate electrodes 5923 connected to the vias 5922 are provided, and gate insulating films 6920 and semiconductor layers 6910 are provided under the gate electrodes 5923. The semiconductor layers 6910 include VVDD connection sections 6911 and VDD connection sections 6912 on both sides of the centerlines of the semiconductor layers 6910 in the X-direction. The insulating layer 25 has vias 8913 formed therein to electrically connect the VVDD connection sections 6911 to the power lines 8110 (see FIGS. 9-12) and vias 7913 to electrically connect the VDD connection sections 6912 to the power lines 7110 (see FIGS. 9-12). The plurality of semiconductor layers 6910 are arranged in the Y-direction.

Thus, in the ninth embodiment, the switch transistors 51 are provided in the regions where the control signal lines 5930 intersect the control signal lines 5110 or 5910 in plan view.

In the ninth embodiment, the parasitic capacitance and resistance with respect to the control signal lines 5930 are great. A control signal from the power switch control circuit is sequentially transmitted to each switch transistor 51 through the control signal lines 5930. Therefore, VVDD potential rise in the second power domain 31B can be made gentler, and power source noise occurring due to steep potential rise can be reduced.

The control signal lines 5930 arranged side by side in the Y-direction may be connected together outside of the second power domain 31B in plan view via control signal lines provided in a surface layer portion of the second chip 20 instead of the control signal lines 5910.

Tenth Embodiment

Figure 28:
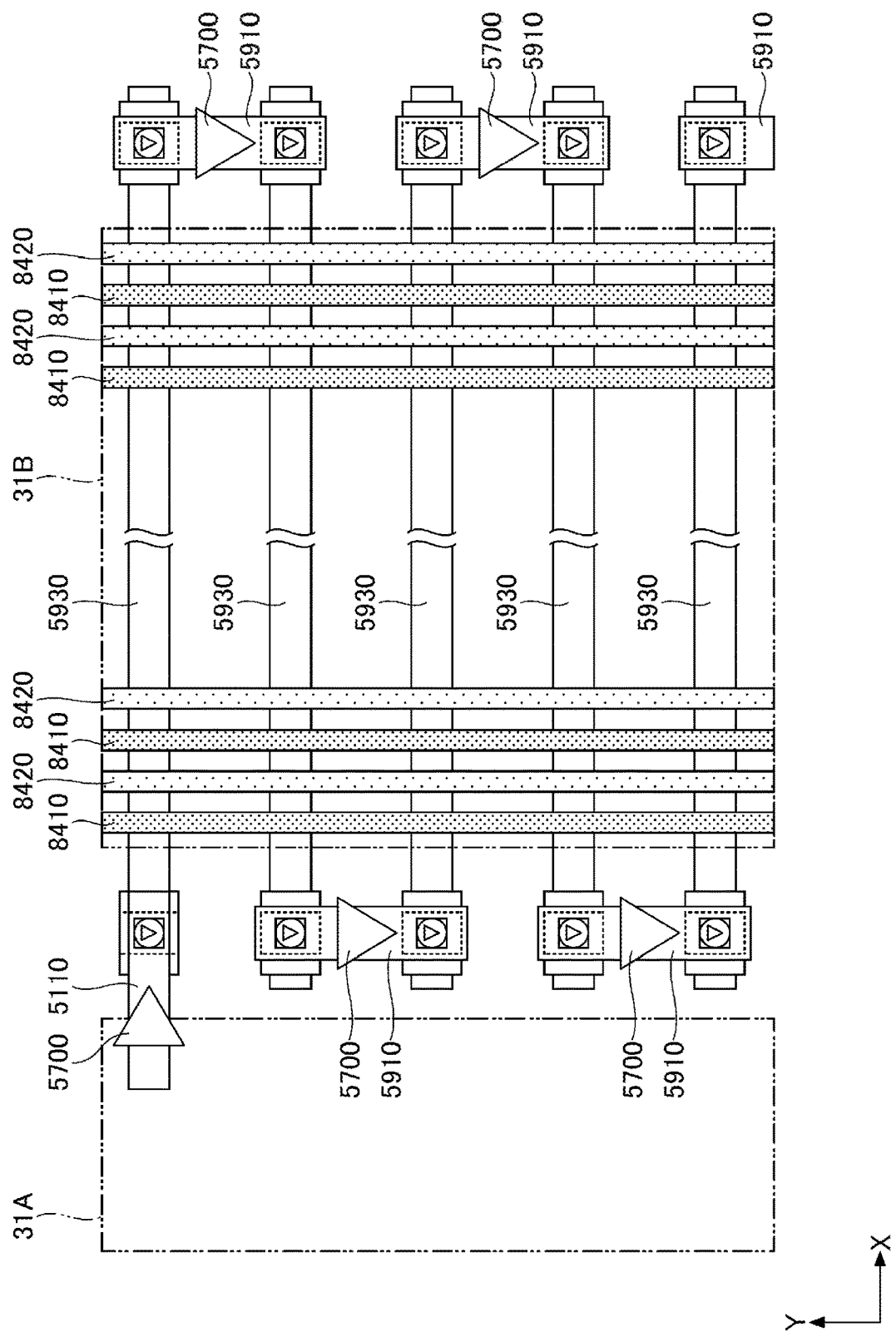
FIG. 28 is a schematic diagram depicting a configuration of a semiconductor device according to a tenth embodiment in plan view.

Next, a tenth embodiment will be described. The tenth embodiment differs from the ninth embodiment in that buffers are added to the control signal lines. FIG. 28 is a schematic diagram depicting a configuration of a semiconductor device according to the tenth embodiment. In FIG. 28, in particular, portions for the arrangement of control signal lines are depicted, and the semiconductor layers, some power lines, vias, and the like are omitted.

In the tenth embodiment, buffers 5700 are added to the control signal lines 5110 and 5910, as depicted in FIG. 28. For example, the buffers 5700 are provided in the first chip 10. For example, the buffers 5700 are supplied voltage from the VDD interconnections and the VSS interconnections, in the same way as the buffer 60. The buffers 5700 may be provided in the first power domain 31A, similar to the buffer 60. The other configurations are the same as or similar to those of the ninth embodiment.

The buffers 5700 can function as delay circuits. Therefore, delays in transmission of control signals by the buffers 5700 can be used to control the timings of operations of the switch transistors 51.

Eleven Embodiment

Figure 29:
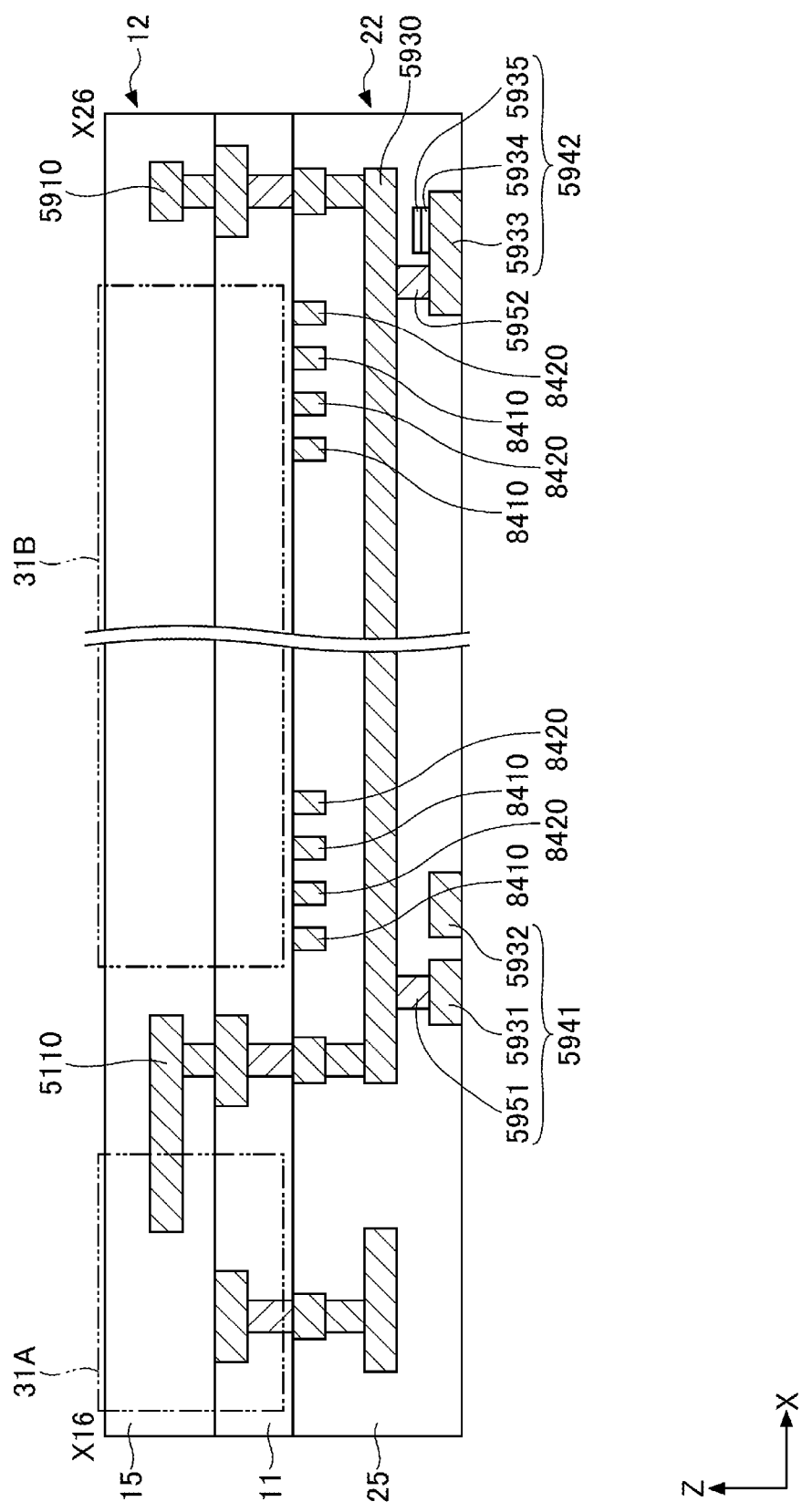
FIG. 29 is a cross-sectional diagram depicting a semiconductor device according to an eleventh embodiment.

Next, an eleventh embodiment will be described. The eleventh embodiment differs from the ninth embodiment, etc., in that a configuration that increases a parasitic capacitance of the control signal line is added. FIG. 29 is a cross-sectional diagram depicting a semiconductor device according to the eleventh embodiment. In FIG. 29, in particular, portions for the control signal line and the switch transistor are depicted, and the semiconductor layers, some power lines, vias, and the like are omitted.

In the eleventh embodiment, as depicted in FIG. 29, an interconnection capacitance section 5941 that includes interconnections 5931 and 5932 arranged to be next to each other is connected to the control signal line 5930 via a via 5951. For example, the interconnections 5931 and 5932 extend in the Y-direction and the via 5951 is connected to the interconnection 5931.

Additionally, an interconnection 5933 extending in the Y-direction is connected to the control signal line 5930 via a via 5952. An insulating film 5934 and a conductive film 5935 are formed on the interconnection 5933. A capacitance element 5942 is formed of the interconnection 5933, the insulating film 5934, and the conductive film 5935.

In the eleventh embodiment, through the interconnection capacitance section 5941 and the capacitance element 5942, the control signal line 5930 is provided with a great parasitic capacitance. For this reason, the effect of suppressing a steep rise of the potential can be increased.

Only one of the interconnection capacitance section 5941 or the capacitance element 5942 may be provided. Also the other embodiments may include the interconnection capacitances sections 5941 or the capacitance elements 5942, or both.

Figure 30:
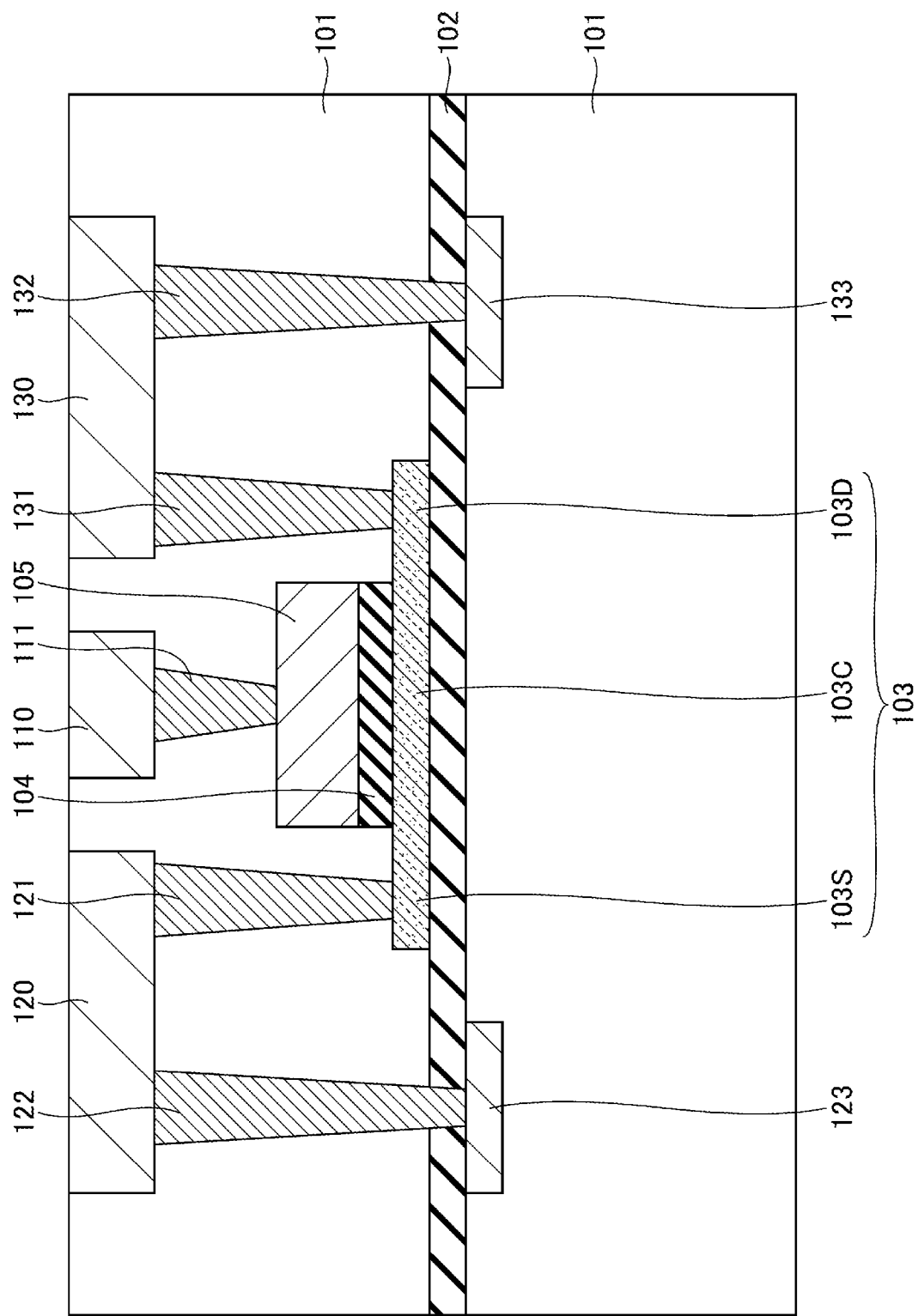
FIG. 30 is a cross-sectional diagram depicting an example of a switch transistor.
Figure 31:
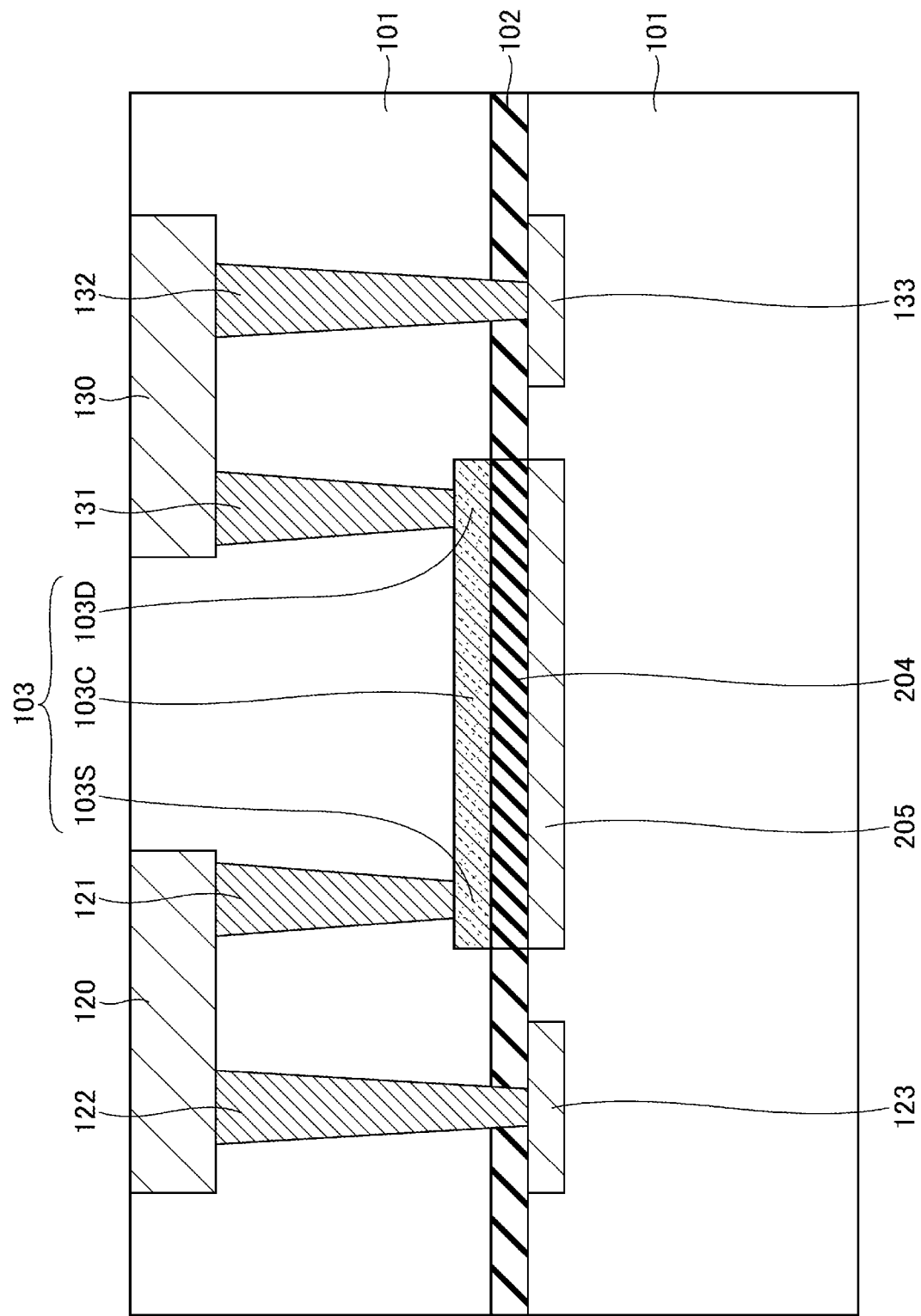
FIG. 31 is a cross-sectional diagram depicting the example of the switch transistor.

An outline of a cross-sectional configuration of the switch transistors will now be described. FIGS. 30 and 31 are cross-sectional diagrams depicting an example of a cross-sectional configuration of the switch transistors.

In a first example depicted in FIG. 30, a base insulating film 102 is provided in an insulating layer 101, and a semiconductor layer 103, a gate insulating film 104, and a gate electrode 105 are provided on the base insulating film 102. A control signal line 110, a power line 120 corresponding to a VDD interconnection, and a power line 130 corresponding to the VVDD interconnection are provided in a surface layer portion of the insulating layer 101. The semiconductor layer 103 includes a channel 103C, and a source 103S and a drain 103D which sandwich the channel 103C. The power line 120 and a source 103S are connected via a via 121, and the power line 130 and a drain 103D are connected via a via 131. A power line 123 corresponding to a VDD interconnection and a power line 133 corresponding to a VVDD interconnection are provided beneath the base insulating film 102. The power line 120 and the power line 123 are connected via a via 122, and the power line 130 and the power line 133 are connected via a via 132. The control signal line 110 is connected to the gate electrode 105 via a via 111.

In a second example depicted in FIG. 31, a base insulating film 102 includes a gate insulating film 204, a semiconductor layer 103 is provided above the gate insulating film 204, and a gate electrode 205 is provided below the gate insulating film 204. The other configurations are the same as or similar to those of the first example.

A material of the base insulating film may be, for example, silicon oxide, silicon nitride, silicon carbide, silicon oxide nitride, silicon oxide carbide, or the like. A material of the semiconductor layer is, for example, InGaZnO (IGZO), ZnO, ZnSnO, InZnO, or the like. A material of the gate insulating film may be, for example, $SiO_2$, SiOxNy, SiN, $Al_2O_3$, or the like. A material of the gate electrode may be, for example, molybdenum, titanium, chromium, tantalum, magnesium, silver, tungsten, aluminum, copper, neodymium, ruthenium, scandium, or the like. A material of the gate electrode may be graphene, or the like.

The switch transistors 51 used in each of the above-described embodiments are classified into the first and second examples in terms of the lamination relationships between the gate electrode and the semiconductor layer and the connection relationships between the semiconductor layer and the VDD interconnection, as follows. That is, the switch transistors 51 used in the first to seventh, ninth, and tenth embodiments are classified as the first examples. The switch transistors 51 used in the eighth embodiment are classified as the second examples.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a depicting of the superiority and inferiority of the invention. Although the semiconductor devices have been described with reference to the embodiments, it should be understood that the invention is not limited to these embodiments, and the various changes, substitutions, and alterations could be made hereto without departing from the spirit and scope of the invention.

What is claimed is:
1. A semiconductor device, comprising:
a first chip including a substrate and a first interconnection layer formed on a first surface of the substrate; and
a second interconnection layer formed on a second surface opposite to the first surface of the substrate,
wherein
the second interconnection layer includes
a first power line to which a first power potential is applied,
a second power line to which a second power potential is applied, and
a switch connected between the first power line and the second power line,
the first chip includes
a first grounding line,
a third power line to which the second power potential is applied,
a first region in which the first grounding line and the third power line are disposed,
a second grounding line,
a fourth power line to which the first power potential is applied, and
a second region in which the second grounding line and the fourth power line are disposed, and
in plan view, the switch is disposed between the first region and the second region.

2. The semiconductor device as claimed in claim 1, wherein
the second region includes a control circuit that is connected between the second grounding line and the fourth power line and is configured to control the switch.

3. The semiconductor device as claimed in claim 1, wherein
the first grounding line and the second grounding line are electrically connected to each other.

4. The semiconductor device as claimed in claim 1, wherein
the first power line includes a portion overlapping the second region in plan view,
the second power line includes a portion overlapping the first region in plan view, and
the first power line and second power line are connected to the switch between the first region and the second region.

5. The semiconductor device as claimed in claim 1, wherein
the first power line and the second power line extend in a first direction in plan view,
at least a portion of the first region and the second region are arranged along the first direction,
a plurality of first power lines, including the first power line, to which the first power potential is applied, and a plurality of second power lines, including the second power line, to which the second power potential is applied, are arranged side by side in a second direction perpendicular to the first direction, and
the switch is connected in common between the plurality of first power lines and the plurality of second power lines.

6. The semiconductor device as claimed in claim 1, wherein
the first power line and the second power line extend in a first direction in plan view,
the first region and the second region are arranged along a second direction perpendicular to the first direction in plan view, and
a plurality of switches, including the switch, are connected between the first power line and the second power line.

7. The semiconductor device as claimed in claim 6, wherein
the first grounding line and the third power line extend in the first direction.

8. The semiconductor device as claimed in claim 1, wherein
a plurality of first power lines, including the first power line, to which the first power potential is applied, and a plurality of second power lines, including the second power line, to which the second power potential is applied, are arranged side by side along a second direction perpendicular to a first direction along which the first region and the second region are arranged side by side,
the plurality of first power lines have respective first portions between the first region and the second region, the plurality of second power lines have respective second portions between the first region and the second region, the first portions and the second portions are alternately arranged in the second direction, and the switch is connected between a first portion of the first portions and a second portion of the second portions, the first portion and the second portion being arranged next to each other along the second direction.

9. The semiconductor device as claimed in claim 8, wherein a first portion of the first portions is shared by more than one of the plurality of first power lines, and a second portion of the second portions is shared by more than one of the plurality of second power lines.

10. The semiconductor device as claimed in claim 1, wherein the switch includes a semiconductor layer connected to the first power line and the second power line, a gate electrode, and a gate insulating film provided between the semiconductor layer and the gate electrode.

11. The semiconductor device as claimed in claim 10, wherein the gate insulating film is formed on a surface of the semiconductor layer that faces the first chip, and the gate electrode is formed on a surface of the gate insulating film that faces the first chip.

12. The semiconductor device as claimed in claim 10, wherein the gate insulating film is formed on a surface of the semiconductor layer opposite to a surface of the semiconductor layer that faces the first chip, and the gate electrode is formed on a surface of the gate insulating film opposite to a surface of the gate insulating film that faces the first chip.

13. The semiconductor device as claimed in claim 1, wherein a first switch group including a plurality of switches that include the switch, connected between the first power line and the second power line, and a second group of switches connected between the first power line and the second power line, are disposed, the first region being interposed between the first switch group and the second switch group in plan view, and the switches included in the first switch group and the switches included in the second switch group are alternately connected in parallel.

14. The semiconductor device as claimed in claim 13, wherein control terminals of the first switch group and control terminals of the second switch group are connected to each other via buffers outside the first region.

15. The semiconductor device as claimed in claim 13, further comprising capacitance elements connected to control terminals of the first switch group and to control terminals of the second switch group.

\* \* \* \* \*